United States Patent
Sindhushayana

(10) Patent No.: US 7,173,974 B2
(45) Date of Patent: Feb. 6, 2007

(54) METHOD AND APPARATUS FOR COMPUTING SOFT DECISION INPUT METRICS TO A TURBO DECODER

(75) Inventor: Nagabhushana Sindhushayana, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 791 days.

(21) Appl. No.: 10/600,889

(22) Filed: Jun. 20, 2003

(65) Prior Publication Data
US 2004/0181744 A1     Sep. 16, 2004

Related U.S. Application Data

(63) Continuation of application No. 09/521,358, filed on Mar. 8, 2000, now Pat. No. 6,594,318, which is a continuation-in-part of application No. 09/454,177, filed on Dec. 2, 1999, now abandoned.

(51) Int. Cl.
*H04L 5/12* (2006.01)
(52) U.S. Cl. .................. 375/262; 375/341; 375/280
(58) Field of Classification Search ............... 375/261, 375/262, 264, 280, 281, 265, 269, 273, 274, 375/279, 316, 324, 329, 340, 341; 714/786, 714/794, 796, 798
See application file for complete search history.

(56) References Cited

U.S. PATENT DOCUMENTS 5,657,354 A * 8/1997 Thesling et al. ............ 375/332
5,805,017 A * 9/1998 Razzell ....................... 329/300

* cited by examiner

*Primary Examiner*—Dac Ha
*Assistant Examiner*—Jaison Joseph
(74) *Attorney, Agent, or Firm*—Thomas R. Rouse; Thien Nguyen; Sandra L. Godsey

(57) ABSTRACT

A method and apparatus for computing soft decision input metrics to a turbo decoder includes circuits associated with eight-ary phase shift keyed (8PSK) modulation and sixteen-ary quadrature amplitude modulation (16QAM). In both implementations log-likelihood ratio (LLR) metrics on code symbols are estimated as products of various constant values and various combinations of the in-phase and quadrature components of a demodulated soft decision. In the implementation associated with the 16QAM modulation scheme, an estimate of the carrier-signal-to-interference (C/I) ratio is also used to estimate some of the LLR metrics. Estimates of the LLR metrics may also be obtained in association with generalized square QAM and M-ary PSK modulation schemes including, e.g., 64QAM, 256QAM, and 16PSK.

16 Claims, 16 Drawing Sheets

METHOD AND APPARATUS FOR COMPUTING SOFT DECISION INPUT METRICS TO A TURBO DECODER

CLAIM OF PRIORITY UNDER 35 U.S.C. §120

The present Application for Patent is a Continuation application and claims priority to patent application Ser. No. 09/521,358 entitled "METHOD AND APPARATUS FOR COMPUTING SOFT DECISION INPUT METRICS TO A TURBO DECODER" filed Mar. 8, 2000, now U.S. Pat. No. 6,594,318, and assigned to the assignee hereof and hereby expressly incorporated by reference herein; which is a continuation-in-part of U.S. application Ser. No. 09/454,177, filed Dec. 2, 1999 now abandoned.

BACKGROUND

I. Field of the Invention

The present invention pertains generally to the field of communications, and more particularly to computation of soft decision input metrics for turbo decoders.

II. Background

Transmission of digital data is inherently prone to interference, which may introduce errors into the transmitted data. Error detection schemes have been suggested to determine as reliably as possible whether errors have been introduced into the transmitted data. For example, it is common to transmit data in packets and add to each packet a cyclic redundancy check (CRC) field, for example of a length of sixteen bits, which carries a checksum of the data of the packet. When a receiver receives the data, the receiver calculates the same checksum on the received data and verifies whether the result of the calculation is identical to the checksum in the CRC field.

When the transmitted data is not used in real time, it may be possible to request retransmission of erroneous data when errors are detected. However, when the transmission is performed in real time, such as, e.g., in voice calls over traditional telephones or cellular phones, video conference calls, etc., it is not possible to request retransmission.

Convolutional codes have been introduced to allow receivers of digital data to correctly determine the transmitted data even when errors may have occurred during transmission. The convolutional codes introduce redundancy into the transmitted data and pack the transmitted data into packets in which the value of each bit is dependent on earlier bits in the sequence. Thus, when errors occur, the receiver can still deduce the original data by tracing back possible sequences in the received data.

To further improve the performance of a transmission channel, some coding schemes include interleavers, which mix up the order of the bits in the packet during coding. Thus, when interference destroys some adjacent bits during transmission, the effect of the interference is spread out over the entire original packet and can more readily be overcome by the decoding process. Other improvements may include multiple-component codes that encode the packet more than once, in parallel or in series. For example, it is known in the art to employ an error correction method that uses at least two convolutional coders in parallel. Such parallel encoding is commonly referred to as turbo coding.

Turbo codes are serial or parallel concatenations of two or more constituent coders separated by one or more code interleavers. Turbo codes are often decoded with a relatively efficient iterative algorithm to achieve low error rates at signal-to-noise ratios (SNRs) approaching the Shannon limit. The interleavers and deinterleavers are inserted between the component code encoders and decoders, respectively.

As discussed above, the interleaver in a turbo coder spreads the codewords output from an encoder so that individual bits of a given codeword are separated from each other and transmitted at different times. Consequently, individual bits of a given code experience independent fading such that the bits affected by an error burst belong to different codewords. At the receiver, the received samples are deinterleaved prior to decoding. Hence, the effect of the error burst is spread over the message so that it is possible to recover the data with the original error-correcting code. The performance of turbo codes depends on the length and structure of the code interleavers used. Various types of interleavers are known in the art including, e.g., diagonal interleavers, convolutional interleavers, block interleavers, interblock interleavers, and pseudo-random interleavers. Good turbo code performance can be achieved by using interleavers having pseudo-random structures.

Turbo coding represents an important advancement in the area of forward error correction (FEC). There are many variants of turbo coding, but most types of turbo coding use multiple encoding steps separated by interleaving steps combined with the use of iterative decoding. This combination provides previously unattainable performance with respect to noise tolerance in a communications system. Namely, turbo coding allows reliable communications at lower energy-per-bit per noise power spectral density (Eb/NO) than was previously possible using the existing forward error correction techniques.

For multiple-component codes such as turbo codes, optimal decoding is often a very complex task, and may require large periods of time not usually available for on-line decoding. The task may, in fact, be almost impossible, requiring theoretical completion times on the order of the age of the universe. Iterative decoding techniques have been developed to overcome this problem. Rather than determining immediately whether received bits are zero or one, the receiver assigns each bit a value on a multilevel scale representative of the probability that the bit is one. A common scale, referred to as log-likelihood ratio (LLR) probabilities, represents each bit by an integer in some range, e.g., $\{-32,31\}$. A. value of 31 signifies that the transmitted bit was a zero with very high probability, and a value of $-32$ signifies that the transmitted bit was a one, with very high probability. A value of zero indicates that the logical bit value is indeterminate.

Data represented on the multilevel scale is referred to as "soft data," and iterative decoding is usually soft-in/soft-out, i.e., the decoding process receives a sequence of inputs corresponding to probabilities for the bit values and provides as output corrected probabilities, taking into account constraints of the code. Generally, a decoder that performs iterative decoding uses soft data from former iterations to decode the soft data read by the receiver. During iterative decoding of multiple-component codes, the decoder uses results from decoding of one code to improve the decoding of the second code. When parallel encoders are used, as in turbo coding, two corresponding decoders may conveniently be used in parallel for this purpose. Such iterative decoding is carried out for a plurality of iterations until it is believed that the soft data closely represents the transmitted data. Those bits that have a probability indicating that they are closer to one (for example, values between 0 and 31 on the scale described above) are assigned binary zero, and the remaining values are assigned binary one.

An LLR is thus a probability metric used by a turbo decoder to determine whether a given symbol was transmitted given a particular received symbol. To compute the LLR, an accurate estimate of the SNR and the channel coefficient (a complex scale factor applied to the transmitted signal by the channel) are required. Accurate LLR values are particularly important in turbo decoding applications in which the LLR inputs are typically subjected to nonlinear operations that can amplify inaccuracies in the LLR values and result in unacceptable decoder performance.

It is computationally intensive to compute LLR metrics for dense signal constellations with the high degree of accuracy required. Either an elaborate computation scheme must be employed or a complex decoder structure must be used. Turbo coders are already significantly more complex to implement than are convolutional coders. Hence, it is has proven to be advantageous to maintain the turbo decoder structure at the cost of using a computationally intensive LLR calculation technique. However, it is undesirable to employ a computationally complex LLR calculation algorithm because of the associated drain on processor and memory resources. Moreover, for certain modulation schemes such as eight-ary phase shift keying (8PSK) and sixteen-ary quadrature amplitude modulation (16QAM) it is exceptionally difficult to compute the LLR metrics. It would be desirable to provide a simplified method for deriving the LLR metrics based upon estimation rather than direct computation. Thus, there is a need for a simplified technique for computing the soft-decision input metrics to a turbo decoder without degrading the performance of the decoder.

SUMMARY

The present invention is directed to a simplified technique for computing the soft-decision input metrics to a turbo decoder without degrading the performance of the decoder. Accordingly, in one aspect of the invention, a method of approximating log-likelihood ratio metrics for a plurality of turbo encoded symbols, the plurality of turbo encoded symbol having been modulated with square quadrature amplitude modulation signal constellations having gray code labeling, is provided. The method advantageously includes the steps of extracting a complex-valued modulation symbol soft decision on a modulation symbol, the modulation symbol being associated with a plurality of turbo encoded symbols, the complex-valued modulation symbol soft decision having an in-phase component and a quadrature component; scaling the complex-valued modulation symbol soft decision to obtain a log-likelihood ratio metric for a most-significant code symbol of the modulation symbol; and applying a linear combination of a triangle function and a ramp function to the complex-valued modulation symbol soft decision to obtain log-likelihood ratio metrics for remaining code symbols of the modulation symbol.

In another aspect of the invention, a receiver configured to approximate log-likelihood ratio metrics for a plurality of turbo encoded symbols, the plurality of turbo encoded symbol having been modulated with square quadrature amplitude modulation signal constellations having gray code labeling, is provided. The receiver advantageously includes a demodulator configured to extract a complex-valued modulation symbol soft decision on a received modulation symbol, the modulation symbol being associated with a plurality of turbo encoded symbols, the complex-valued modulation symbol soft decision having an in-phase component and a quadrature component; and a log-likelihood ratio computation module coupled to the demodulator and configured to receive the complex-valued modulation symbol soft decision from the demodulator, scale the complex-valued modulation symbol soft decision to obtain a log-likelihood ratio metric for a most-significant code symbol of the modulation symbol, and apply a linear combination of a triangle function and a ramp function to the complex-valued modulation symbol soft decision to obtain log-likelihood ratio metrics for remaining code symbols of the modulation symbol.

In another aspect of the invention, a receiver configured to approximate log-likelihood ratio metrics for a plurality of turbo encoded symbols, the plurality of turbo encoded symbol having been modulated with square quadrature amplitude modulation signal constellations having gray code labeling, is provided. The receiver advantageously includes means for extracting a complex-valued modulation symbol soft decision on a received modulation symbol, the modulation symbol being associated with a plurality of turbo encoded symbols, the complex-valued modulation symbol soft decision having an in-phase component and a quadrature component; means for scaling the complex-valued modulation symbol soft decision to obtain a log-likelihood ratio metric for a most-significant code symbol of the modulation symbol; and means for applying a linear combination of a triangle function and a ramp function to the complex-valued modulation symbol soft decision to obtain log-likelihood ratio metrics for remaining code symbols of the modulation symbol.

In another aspect of the invention, a receiver configured to approximate log-likelihood ratio metrics for a plurality of turbo encoded symbols, the plurality of turbo encoded symbol having been modulated with square quadrature amplitude modulation signal constellations having gray code labeling, is provided. The receiver advantageously includes a processor; and a processor-readable storage medium coupled to the processor and containing a set of instructions executable by the processor to extract a complex-valued modulation symbol soft decision on a received modulation symbol, the modulation symbol being associated with a plurality of turbo encoded symbols, the complex-valued modulation symbol soft decision having an in-phase component and a quadrature component, scale the complex-valued modulation symbol soft decision to obtain a log-likelihood ratio metric for a most-significant code symbol of the modulation symbol, and apply a linear combination of a triangle function and a ramp function to the complex-valued modulation symbol soft decision to obtain log-likelihood ratio metrics for remaining code symbols of the modulation symbol.

In another aspect of the invention, a method of approximating log-likelihood ratio metrics for a plurality of turbo encoded symbols, the plurality of turbo encoded symbol having been modulated with M-ary phase shift keyed signal constellations having gray code labeling, is provided. The method advantageously includes the steps of extracting a complex-valued modulation symbol soft decision on a modulation symbol, the modulation symbol being associated with a plurality of turbo encoded symbols, the complex-valued modulation symbol soft decision having an in-phase component and a quadrature component; scaling the quadrature component to obtain a log-likelihood ratio metric for a most-significant code symbol of the modulation symbol; scaling the in-phase component to obtain a log-likelihood ratio metric for a second-most-significant code symbol of the modulation symbol; and applying a product of a first number and a second number to the complex-valued modulation symbol soft decision to obtain log-likelihood ratio metrics for remaining code symbols of the modulation symbol, the first number being dependent on a magnitude of the complex-valued modulation symbol soft decision, and the second number being dependent on a phase of the complex-valued modulation symbol soft decision.

In another aspect of the invention, a receiver configured to approximate log-likelihood ratio metrics for a plurality of turbo encoded symbols, the plurality of turbo encoded symbol having been modulated with M-ary phase shift keyed signal constellations having gray code labeling, is provided. The receiver advantageously includes a demodulator configured to extract a complex-valued modulation symbol soft decision on a received modulation symbol, the modulation symbol being associated with a plurality of turbo encoded symbols, the complex-valued modulation symbol soft decision having an in-phase component and a quadrature component; and a log-likelihood ratio computation module coupled to the demodulator and configured to receive the complex-valued modulation symbol soft decision from the demodulator, scale the quadrature component to obtain a log-likelihood ratio metric for a most-significant code symbol of the modulation symbol, scale the in-phase component to obtain a log-likelihood ratio metric for a second-most-significant code symbol of the modulation symbol, and apply a product of a first number and a second number to the complex-valued modulation symbol soft decision to obtain log-likelihood ratio metrics for remaining code symbols of the modulation symbol, the first number being dependent on a magnitude of the complex-valued modulation symbol soft decision, and the second number being dependent on a phase of the complex-valued modulation symbol soft decision.

In another aspect of the invention, a receiver configured to approximate log-likelihood ratio metrics for a plurality of turbo encoded symbols, the plurality of turbo encoded symbol having been modulated with M-ary phase shift keyed signal constellations having gray code labeling, is provided. The receiver advantageously includes means for extracting a complex-valued modulation symbol soft decision on a received modulation symbol, the modulation symbol being associated with a plurality of turbo encoded symbols, the complex-valued modulation symbol soft decision having an in-phase component and a quadrature component; means for scaling the quadrature component to obtain a log-likelihood ratio metric for a most-significant code symbol of the modulation symbol; means for scaling the in-phase component to obtain a log-likelihood ratio metric for a second-most-significant code symbol of the modulation symbol; and means for applying a product of a first number and a second number to the complex-valued modulation symbol soft decision to obtain log-likelihood ratio metrics for remaining code symbols of the modulation symbol, the first number being dependent on a magnitude of the complex-valued modulation symbol soft decision, and the second number being dependent on a phase of the complex-valued modulation symbol soft decision.

In another aspect of the invention, a receiver configured to approximate log-likelihood ratio metrics for a plurality of turbo encoded symbols, the plurality of turbo encoded symbol having been modulated with M-ary phase shift keyed signal constellations having gray code labeling, is provided. The receiver advantageously includes a processor; and a processor-readable storage medium coupled to the processor and containing a set of instructions executable by the processor to extract a complex-valued modulation symbol soft decision on a received modulation symbol, the modulation symbol being associated with a plurality of turbo encoded symbols, the complex-valued modulation symbol soft decision having an in-phase component and a quadrature component, scale the quadrature component to obtain a log-likelihood ratio metric for a most-significant code symbol of the modulation symbol, scale the in-phase component to obtain a log-likelihood ratio metric for a second-most-significant code symbol of the modulation symbol, and apply a product of a first number and a second number to the complex-valued modulation symbol soft decision to obtain log-likelihood ratio metrics for remaining code symbols of the modulation symbol, the first number being dependent on a magnitude of the complex-valued modulation symbol soft decision, and the second number being dependent on a phase of the complex-valued modulation symbol soft decision.

In another aspect of the invention, a device for estimating log-likelihood ratio (LLR) decoder metrics from a soft decision having an in-phase component and a quadrature component, the soft decision having been demodulated in accordance with eight-ary phase shift keyed (8PSK) signal constellations having gray code labeling, is provided. The device advantageously includes a first multiplier configured to multiply the in-phase component by a first constant value to generate a first LLR metric; a second multiplier configured to multiply the quadrature component by the first constant value to generate a second LLR metric; and a module configured to subtract an absolute value of the quadrature component from an absolute value of the in-phase component to (1) produce a difference value, (2) add the absolute value of the in-phase component to the absolute value of the quadrature component to produce a sum value, (3) divide a second constant value by a square root of a sum of a square of the in-phase component and a square of the quadrature component to produce a quotient value, and (4) multiply the difference value, the sum value, and the quotient value to generate a third LLR metric.

In another aspect of the invention, a method of estimating log-likelihood (LLR) decoder metrics from a soft decision having an in-phase component and a quadrature component, the soft decision having been demodulated in accordance with eight-ary phase shift keyed (8PSK) signal constellations having gray code labeling, is provided. The method advantageously includes the steps of multiplying the in-phase component by a first constant value to obtain a first LLR metric; multiplying the quadrature component by the first constant value to obtain a second LLR metric; multiplying a subtraction value equal to a difference between an absolute value of the in-phase component and an absolute value of the quadrature component by an addition value equal to a sum of the absolute value of the in-phase component and the absolute value of the quadrature component to obtain an intermediate value; and multiplying the intermediate value by a division value equal to a quotient of a second constant value and a square root of a sum of a square of the in-phase component and a square of the quadrature component to obtain a third LLR metric.

In another aspect of the invention, a device for estimating log-likelihood (LLR) decoder metrics from a soft decision having an in-phase component and a quadrature component, the soft decision having been demodulated in accordance with eight-ary phase shift keyed (8PSK) signal constellations having gray code labeling, is provided. The device advantageously includes means for multiplying the in-phase component by a first constant value to obtain a first LLR metric; means for multiplying the quadrature component by the first constant value to obtain a second LLR metric; means for multiplying a subtraction value equal to a difference between an absolute value of the in-phase component and an absolute value of the quadrature component by an addition value equal to a sum of the absolute value of the in-phase component and the absolute value of the quadrature component to obtain an intermediate value; and means for multiplying the intermediate value by a division value equal to a quotient of a second constant value and a square root of a sum of a square of the in-phase component and a square of the quadrature component to obtain a third LLR metric.

In another aspect of the invention, a device for estimating log-likelihood (LLR) decoder metrics from a soft decision having an in-phase component and a quadrature component, the soft decision having been demodulated in accordance with eight-ary phase shift keyed (8PSK) signal constellations having gray code labeling, is provided. The device advantageously includes a processor; and a memory element coupled to the processor and containing a set of instructions executable by the processor to multiply the in-phase component by a first constant value to obtain a first LLR metric, multiply the quadrature component by the first constant value to obtain a second LLR metric, multiply a subtraction value equal to a difference between an absolute value of the in-phase component and an absolute value of the quadrature component by an addition value equal to a sum of the absolute value of the in-phase component and the absolute value of the quadrature component to obtain an intermediate value, and multiply the intermediate value by a division value equal to a quotient of a second constant value and a square root of a sum of a square of the in-phase component and a square of the quadrature component to obtain a third LLR metric.

In another aspect of the invention, a device for estimating log-likelihood ratio (LLR) decoder metrics from a soft decision having an in-phase component and a quadrature component, the soft decision having been demodulated in accordance with sixteen-ary quadrature amplitude modulation (16QAM) signal constellations having gray code labeling, is provided. The device advantageously includes a first multiplier configured to multiply the in-phase component by a first constant value to generate a first LLR metric; a second multiplier configured to multiply the quadrature component by the first constant value to generate a second LLR metric; a first module configured to subtract a product of a carrier-signal-to-interference (C/I) ratio and a second constant value from an absolute value of the second LLR metric to generate a third LLR metric; and a second module configured to subtract the product of the C/I ratio and the second constant value from an absolute value of the first LLR metric to generate a fourth LLR metric.

In another aspect of the invention, a method of estimating log-likelihood (LLR) decoder metrics from a soft decision having an in-phase component and a quadrature component, the soft decision having been demodulated in accordance with sixteen-ary quadrature amplitude modulation (16QAM) signal constellations having gray code labeling, is provided. The method advantageously includes the steps of multiplying the in-phase component by a first constant value to obtain a first LLR metric; multiplying the quadrature component by the first constant value to obtain a second LLR metric; subtracting a product of a carrier-signal-to-interference (C/I) ratio and a second constant value from an absolute value of the second LLR metric to obtain a third LLR metric; and subtracting the product of the C/I ratio and the second constant value from an absolute value of the first LLR metric to obtain a fourth LLR metric.

In another aspect of the invention, a device for estimating log-likelihood (LLR) decoder metrics from a soft decision having an in-phase component and a quadrature component, the soft decision having been demodulated in accordance with sixteen-ary quadrature amplitude modulation (16QAM) signal constellations having gray code labeling, is provided. The device advantageously includes means for multiplying the in-phase component by a first constant value to obtain a first LLR metric; means for multiplying the quadrature component by the first constant value to obtain a second LLR metric; means for subtracting a product of a carrier-signal-to-interference (C/I) ratio and a second constant value from an absolute value of the second LLR metric to obtain a third LLR metric; and means for subtracting the product of the C/I ratio and the second constant value from an absolute value of the first LLR metric to obtain a fourth LLR metric.

In another aspect of the invention, a device for estimating log-likelihood (LLR) decoder metrics from a soft decision having an in-phase component and a quadrature component, the soft decision having been demodulated in accordance with sixteen-ary quadrature amplitude modulation (16QAM) signal constellations having gray code labeling, is provided. The device advantageously includes a processor; and a memory element coupled to the processor and containing a set of instructions executable by the processor to multiply the in-phase component by a first constant value to obtain a first LLR metric, multiply the quadrature component by the first constant value to obtain a second LLR metric, subtract a product of a carrier-signal-to-interference (C/I) ratio and a second constant value from an absolute value of the second LLR metric to obtain a third LLR metric, and subtract the product of the C/I ratio and the second constant value from an absolute value of the first LLR metric to obtain a fourth LLR metric.

DETAILED DESCRIPTION

Figure 1:
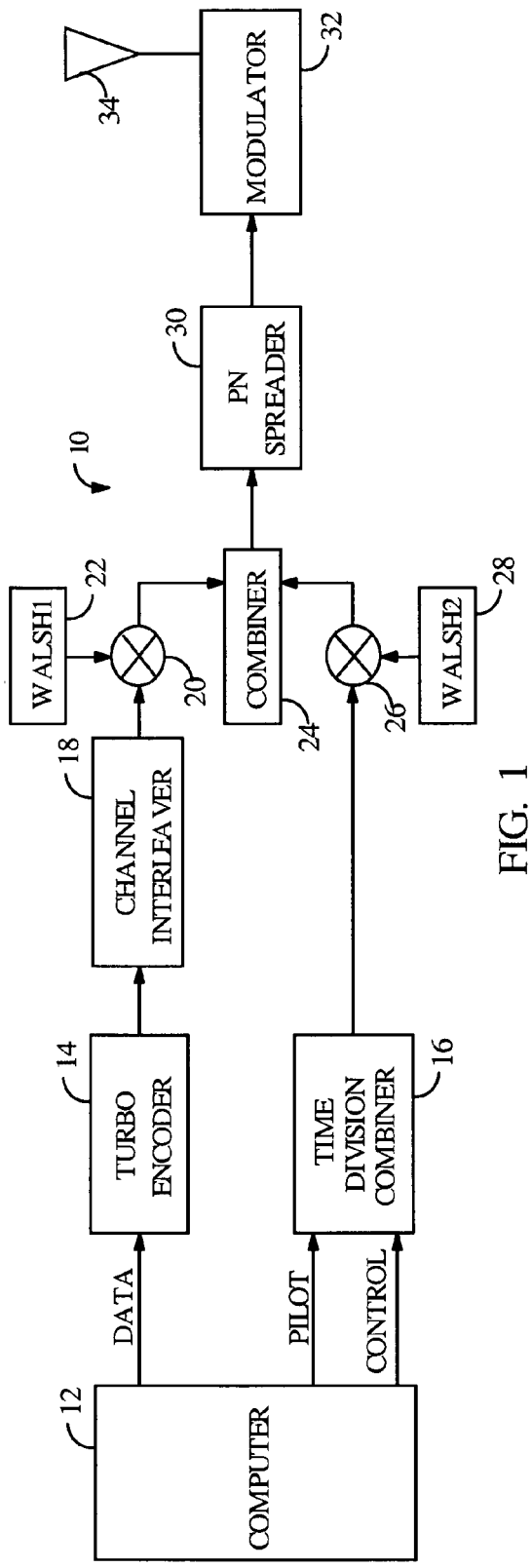
FIG. 1 is a block diagram of a code division multiplexing (CDM) transmitter.

In FIG. 1 a code division multiplexing (CDM) transmitter 10 constructed in accordance with one embodiment is shown. For clarity, various details of the transmitter have been omitted from the drawings such as timing circuitry, filters, and amplifiers. The omitted circuitry is easily constructed and implemented by those having ordinary skill in the art.

The transmitter 10 includes a computer 12 that includes transmitter software executed via a baseband processor (not shown) within the computer 12. The computer 12 is coupled to a turbo encoder 14 and a time division combiner 16. The turbo encoder is coupled to a channel interleaver 18, which is coupled to a first input of a first multiplier 20. A first Walsh function generator 22 is coupled to a second input of the first multiplier 20. An output of the first multiplier 20 is coupled to a first input of a combiner 24.

An output of the time division combiner 16 is coupled to a first input of a second multiplier 26, a second input of which is coupled to a second Walsh function generator 28. An output of the second multiplier 26 is coupled to a second input of the combiner 24. An output of the combiner 24 is coupled to a quadrature pseudo noise sequence (PN) spreader 30. An output of the PN spreader is input to a modulator 32 that is coupled to an antenna 34.

In operation, signals containing data such as voice data or other file data are delivered from the computer 12 to the turbo encoder 14. The turbo encoder 14 encodes the data signal. The turbo encoder 14 is a standard turbo encoder and operates in accordance with turbo encoding principles and methods well known in the art. In a particular embodiment, the turbo encoder 14 is a serial concatenated turbo encoder in which an interleaver (not shown) is disposed between inner and outer constituent, convolutional encoders (also not shown). In an alternate embodiment, the turbo encoder 14 is a parallel concatenated turbo encoder designed in accordance with principles that are well known in the relevant art.

The encoded data signal output from the turbo encoder 14 is then interleaved by the channel interleaver 18 in preparation for Walsh encoding, pseudo-noise (PN) spreading, and modulation. The channel interleaver 18 may be implemented via a conventional interleaver such as a block interleaver.

The computer 12 also provides a predetermined pilot signal, which in the present specific embodiment is a constant equivalent to 1, to the time division combiner 16 with a control signal. The control signal contains rate-control or power-control information for delivery to a corresponding receiver (as described in detail below) to facilitate power and/or code-rate control to maximize communications system efficiency and throughput.

The time division combiner 16 mixes the control signal with the pilot signal in accordance with conventional time division combining methods. The combined signal is input to the second multiplier 26, where it is multiplied by a predetermined Walsh function provided via the second Walsh function generator 28. Similarly, the interleaved data signal output from the channel interleaver 18 is provided to the first multiplier 20 where it is multiplied by another predetermined Walsh function provided by the first Walsh function generator 22.

The resulting Walsh codes output from the first multiplier 20 and the second multiplier 26 are combined via the combiner 24, spread via the PN spreader 30, and subsequently modulated and converted to radio frequency by the modulator 32 in preparation for transmission over a channel via the antenna 34.

The resulting signal transmitted via the antenna 34 is advantageously a composite signal having a data signal, a pilot signal, and a control signal. Once broadcast over a channel, the composite signal will experience multi-path fading and channel interference that must be efficiently detected and compensated for by the receiver system that receives the transmitted signal.

Those skilled in the art will appreciate that the Walsh functions provided by the first Walsh function generator 22 and the second Walsh function generator 28 may be replaced by PN function generators or a combination of Walsh function generators and PN function generators. In addition, the transmitter 10 may be implemented in a base station and/or a mobile station of a cellular or PCS communication system.

In the present detailed description, the terms signal-to-interference and signal-to-noise are equivalent terms.

Figure 2:
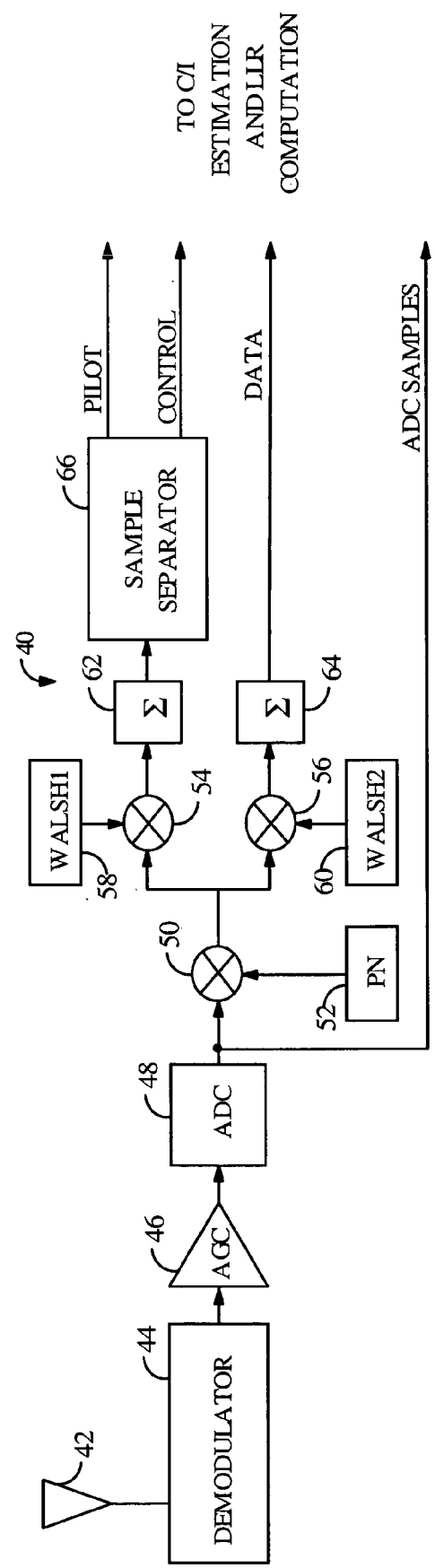
FIG. 2 is a block diagram of a CDM receiver.

In FIG. 2 a CDM receiver 40 constructed in accordance with one embodiment that may be used with the CDM transmitter 10 of FIG. 1 is shown. The transmitter 40 includes a receiver antenna 42 that is coupled to a demodulator circuit 44. The demodulator circuit 44 is coupled to an automatic gain control (AGC) circuit 46 that is coupled to an analog-to-digital converter (ADC) 48. An output of the ADC 48 is coupled to an input of a first receiver multiplier 50. The output of the ADC 48, which represents digital samples, is also provided as input to a carrier-signal-to-interference ratio (C/I) estimation and log-likelihood ratio (LLR) computation circuit, as described in detail below.

Another input of the first receiver multiplier 50 is coupled to an output of a PN sequence generator 52. An output of the first receiver multiplier 50 is coupled, in parallel, to inputs of a second receiver multiplier 54 and a third receiver multiplier 56. A first receiver Walsh generator circuit 58 and a second receiver Walsh generator circuit 60 also provide input to the second receiver multiplier 54 and the third receiver multiplier 56, respectively. Outputs of the second receiver multiplier 54 and the third receiver multiplier 56 are coupled to inputs of a first accumulator 62 and a second accumulator 64, respectively. An output of the first accumulator 62 is coupled to a sample separator and despreader that provides output to a C/I estimation circuit and a LLR computation circuit, as described in detail below.

In operation, a signal transmitted over a channel such as the RF signal transmitted by the transmitter 10 of FIG. 1 is received by the antenna 42 of the receiver 40. The received RF signal is converted to an intermediate frequency signal and subsequently converted to a baseband signal via the demodulator 44. The gain of the baseband signal is adjusted via the AGC circuitry 46 and is subsequently converted to a digital signal via the ADC 48. Subsequently, the baseband signals are multiplied by a PN sequence that is related to the PN sequence employed in the PN spreader 30 of FIG. 1 via the PN sequence generator 52 and the first receiver multiplier 50. In the present specific embodiment, the PN sequence and its inverse are the same because with binary operations (in GF2) the inverse of 1 is 1 and the inverse of 0 is 0.

Subsequently, the first receiver multiplier 50 outputs a partially despread signal, which is split onto two separate paths. On one path, the second receiver multiplier 54 multiplies the partially spread sequence by a Walsh function provided by the first receiver Walsh function generator 58. The provided Walsh function is related to the Walsh function, provided by the first Walsh function generator 22 of FIG. 1. The resulting despread signal samples are input to the first accumulator 62, where they are accumulated over a predetermined number of samples. The accumulated despread data samples are provided to the sample separator 66. The sample separator 66 outputs a pilot signal and a control signal extracted from the despread signal to a C/I estimation circuit and LLR circuit, as described in detail below.

Similarly, despread signal samples output from the third receiver multiplier 56 are accumulated by the second accumulator 64, which outputs a data signal comprising data signal samples to the C/I estimation circuit and LLR circuit, as described in detail below.

Figure 3:
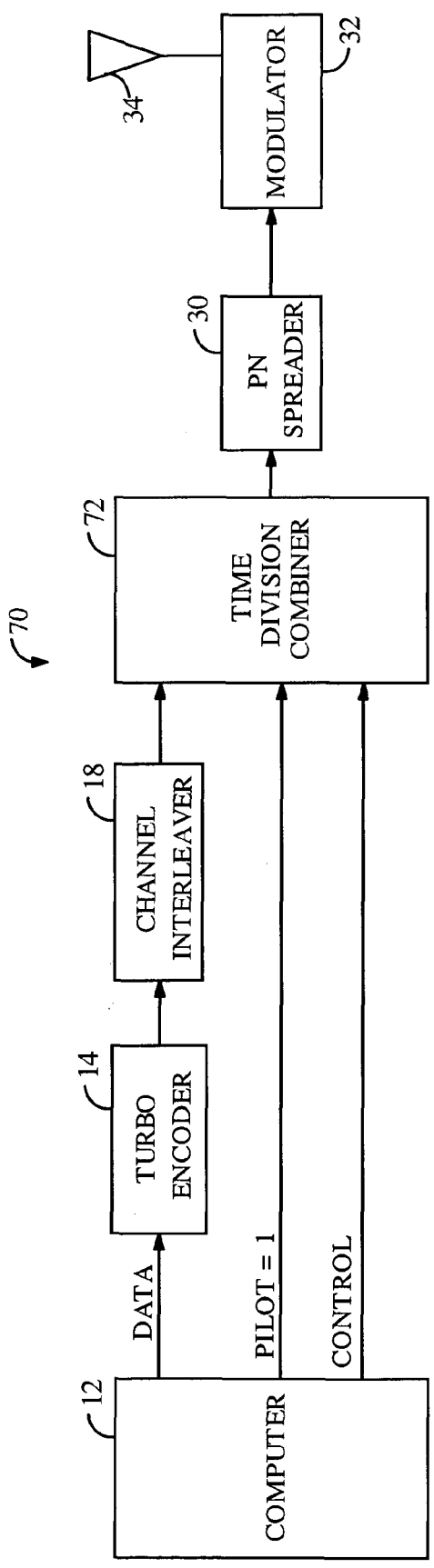
FIG. 3 is a block diagram of a time division multiplexing (TDM) transmitter.

In FIG. 3 a time division multiplexing (TDM) transmitter 70 constructed in accordance with one embodiment is shown. The TDM transmitter 70 is advantageously similar to the CDM transmitter 10 of FIG. 1 with the exception that the time division combiner 16, the multipliers 20, 26, the Walsh function generators 22, 28, and the adder 24 of FIG. 1 are replaced by the time division combiner 72.

Figure 4:
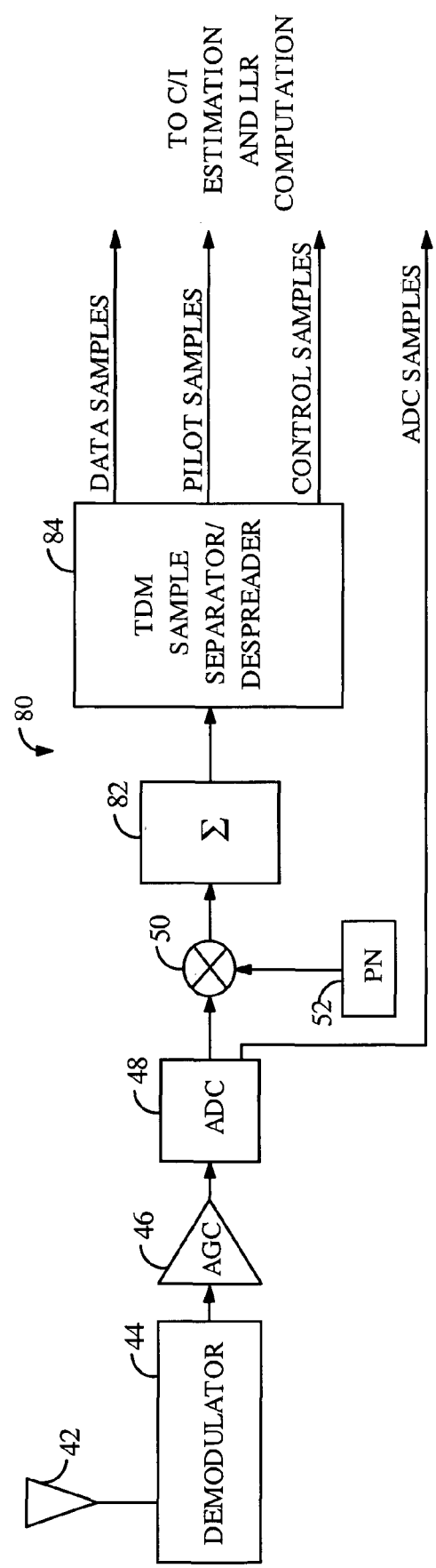
FIG. 4 is a block diagram of a TDM receiver.

In FIG. 4 a TDM receiver 80 constructed in accordance with one embodiment is shown. The TDM receiver 80 is advantageously similar to the CDM receiver 40 of FIG. 2 with the exception that the multipliers 54, 56, the Walsh function generators 58, 60, the accumulators 62, 64, and the sample separator 66 of FIG. 2 are replaced by the accumulator 82 and the TDM sample separator 84. The accumulator 82 receives digital spread samples from the multiplier 50, accumulates the samples, and subsequently provides the accumulated samples to the TDM sample separator 84. The TDM sample separator 84 extracts data samples, pilot samples, and control samples from the accumulated and despread digital signal. The data samples, pilot samples, control samples, and the digital samples output from the ADC 48 are provided to a C/I estimation and LLR circuit, as described in detail below.

Figure 5:
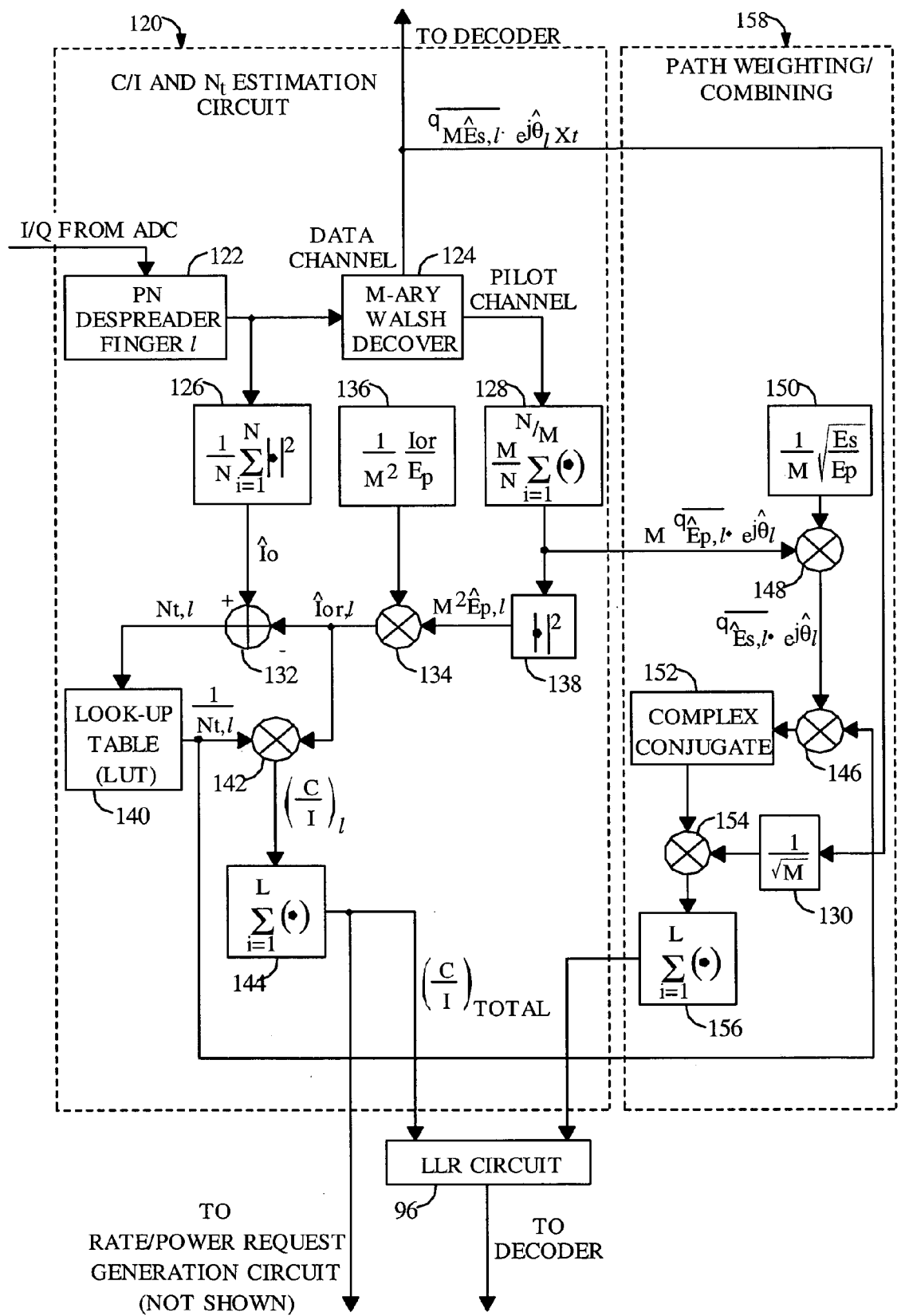
FIG. 5 is a block diagram of a circuit for computing a carrier signal-to-interference ratio (C/I) that may be used with a forward link and the receivers of FIG. 2 or FIG. 4.

In FIG. 5 a C/I estimation circuit 120 constructed in accordance with one embodiment is shown. The C/I estimation circuit 120 is advantageously adapted for use with a forward link and the receivers of FIG. 2 or FIG. 4. The C/I estimation circuit 120 includes a PN despreader 122 that may replace the multiplier 50, the PN sequence generator 52, and the accumulator 82 of the receiver 80 of FIG. 4. An M-ary Walsh decover circuit 124 may replace the TDM sample separator 84 of FIG. 4.

The C/I estimation circuit 120 includes the PN despreader 122, an M-ary Walsh decover circuit 124, a total received signal energy ($I_o$) computation circuit 126, a first constant circuit 136, a pilot filter 128, a subtractor 132, a first multiplier 134, a pilot energy calculation circuit 138, a look-up table (LUT) 140, a second multiplier 142, and a C/I accumulation circuit 144. In the C/I estimation circuit 120, the PN despreader 122 receives digital in-phase (I) and quadrature (Q) signals output from the ADC 48 of FIG. 4. The PN despreader 122 provides input, in parallel, to the M-ary Walsh decover circuit 124 and the $I_o$ computation circuit 126. The M-ary Walsh decover circuit 124 provides input to the pilot filter 128 and to a constant divider circuit 130 in a path weighting and combining circuit 158.

The output of the energy computation circuit 126 is coupled to a positive terminal of the subtractor circuit 132. A negative terminal of the subtractor circuit 132 is coupled to an output terminal of a first multiplier 134. A first input of the first multiplier 134 is coupled to an output of the first constant circuit 136. A second input of the first multiplier 134 is coupled to an output of the pilot energy calculation circuit 138. The pilot filter 128 provides input to the pilot energy calculation circuit 138.

An output of the subtractor 132 is coupled to the LUT 140. An output of the LUT 140 is coupled, in parallel, to a first input of the second multiplier 142 and a first input of a third multiplier 146 in the path weighting and combining circuit 158. A second input of the second multiplier 142 is coupled to the output of the first multiplier 134. An output of the second multiplier 142 is coupled to the C/I accumulator circuit 144, the output of which provides input to the LLR circuit 96.

The path weighting and combining circuit 158 includes a second constant generation circuit 150, a fourth multiplier 148, the third multiplier 146, the constant divider circuit 130, a complex conjugate circuit 152, a fifth multiplier 154, and a path accumulator circuit 156. In the path weighting and combining circuit 158, a first terminal of the fourth multiplier 148 is coupled to the output of the pilot filter 128, which is also coupled to an input of the pilot energy calculation circuit 138 in the C/I estimation circuit 120. A second terminal of the fourth multiplier 148 is coupled to the second constant generation circuit 150. An output of the fourth multiplier 148 is coupled to a second input of the third multiplier 146. The output of the third multiplier 146 provides input to the complex conjugate circuit 152. The output of the complex conjugate circuit 152 is coupled to a first input of the fifth multiplier 154. An output of the constant divider circuit 130 is coupled to a second input of the fifth multiplier 154. An output of the fifth multiplier 154 is coupled to an input of the path accumulator circuit 156. The output of the path accumulator circuit 156 is coupled to a second input of the LLR circuit 96. The output of the LLR circuit is coupled to an input of a decoder (not shown).

In operation, the PN despreader 122 receives the I and Q signals and despreads L fingers, i.e., L individual paths (I). The PN despreader 122 despreads the I and Q signals using an inverse of the PN sequence used to spread the I and Q signals before transmission over the channel. The construction and operation of the PN despreader 122 is well known in the art.

Despread signals are output from the PN despreader 122 and input to the M-ary Walsh decover circuit 124 and the $I_o$ computation circuit 126. The $I_o$ computation circuit 126 computes the total received energy ($I_o$) per chip, which includes both a desired signal component and an interference and noise component. The $I_o$ computation circuit provides an estimate ($\hat{I}_o$) of $I_o$ in accordance with the following equation:

$$\hat{I}_o = \frac{1}{N}\sum_{i=1}^{N}|\cdot|^2 \qquad [1]$$

in which N is the number of chips per pilot burst, and is 64 in the present specific embodiment, and • represents the received despread signal output from the PN despreader 122.

Those skilled in the art would appreciate that $I_o$ may, in the alternative, be computed before despreading by the PN despreader 122. For example, the $I_o$ computation circuit 126 may receive direct input from the I and Q signals received from the ADC 48 of FIGS. 2 and 4 instead of input provided by the PN despreader 122, in which case an equivalent estimate of $I_o$ will be provided at the output of the $I_o$ computation circuit 126.

The M-ary Walsh decover circuit 124 decovers orthogonal data signals, called data channels, and pilot signals, called the pilot channel, in accordance with methods known in the art. In the present specific embodiment, the orthogonal data signals correspond to one data channel s that is represented by the following equation:

$$s = \sqrt{M\hat{E}_{s,l}} \cdot e^{j\hat{\theta}_l} X_t, \quad [2]$$

in which M is the number of chips per Walsh symbol, $\hat{E}_{s,l}$ is the modulation symbol energy of the $l^{th}$ multipath component, $\hat{\theta}_l$ at is the phase of the data channel s, and $X_t$ is the information-bearing component of the data channel s. The decovered data channel is provided to a decoder (as described in detail below) and to the constant divider circuit 130 of the path weighting and combining circuit 158.

It should be understood that while the embodiments described herein are adapted for use with signals comprising various Walsh codes, the embodiments are easily adaptable for use with other types of codes by those ordinarily skilled in the art.

The pilot channel is input to the pilot filter 128. The pilot filter 128 is an averaging filter that acts as a lowpass filter, which removes higher frequency noise and interference components from the pilot channel. The output of the pilot filter 128 p is represented by the following equation:

$$p = M\sqrt{\hat{E}_{p,l}} \cdot e^{j\hat{\theta}_l} \quad [3]$$

in which M is the number of chips per Walsh symbol, $\hat{E}_{p,l}$ is the pilot chip energy of the $l^{th}$ multipath component, and $\hat{\theta}_l$ is the phase of the filtered pilot channel p.

An estimate of the energy of the filtered pilot channel p is computed via the pilot energy calculation circuit 138, which is a square of the complex amplitude of the filtered pilot channel p represented by equation (3). The square of the complex amplitude of the filtered pilot channel p is multiplied by a predetermined scale factor c described by the following equation:

$$c = \frac{1}{M^2} \frac{I_{or}}{E_p}, \quad [4]$$

in which $I_{or}$ is the received energy of the desired signal, i.e., is equivalent to $I_o$ less noise and interference components. $E_p$ is the pilot chip energy. The scale factor c is a known forward link constant in many wireless communications systems.

The scale factor c is multiplied by the energy of the filtered pilot signal p via the first multiplier 134 to yield an accurate estimate $\hat{I}_{or,l}$ of the energy of the received desired signal (Io less noise and interference components) associated with the $l^{th}$ multipath component of the received I and Q signals.

The accurate estimate $\hat{I}_{or,l}$ is subtracted from the estimate of $I_o$ via the subtractor 132 to yield an accurate measurement of the interference energy $(N_{t,l})$ associated with the $l^{th}$ multipath component. $N_{t,l}$ is then provided to the LUT 140, which outputs the reciprocal of $N_{t,l}$ to the third multiplier 146 in the path weighting and combining circuit 158 and to the first input of the second multiplier 142. The second input of the second multiplier 142 is coupled to the output of the first multiplier 134, which provides $\hat{I}_{or,l}$ at the second input terminal of the second multiplier 142. The second multiplier 142 outputs an accurate estimate of the C/I$_l$ (the C/I associated with the $l^{th}$ multipath component) in accordance with the following equation:

$$\left(\frac{C}{I}\right)_l = \frac{\hat{I}_{or,l}}{N_{t,l}}. \quad [5]$$

The accurate C/I value is then accumulated over L paths in the received signal via the C/I accumulator circuit 144. The accumulated C/I values are then provided to the LLR circuit 96 and to a rate/power request generation circuit (not shown), the construction of which is known in the art.

In the path weighting and combining circuit 158, the fourth multiplier 148 multiplies the filtered pilot signal p by a constant k provided by the second constant generation circuit 150. The constant k is computed in accordance with the following equation:

$$k = \frac{1}{M}\sqrt{\frac{E_s}{E_p}}, \quad [6]$$

in which $E_s$ is the modulation symbol energy, $E_p$ is the pilot symbol energy, and M is the number of Walsh symbols per chip as mentioned above. The ratio of $E_s$ to $E_p$ is often known or can be determined for both reverse-link and forward-link transmissions.

The output of the fourth multiplier 148 provides an estimate of the channel coefficient $\hat{\alpha}$ described by the following equation:

$$\hat{\alpha} = \sqrt{\hat{E}_{s,l}} \cdot e^{j\hat{\theta}_l}, \quad [7]$$

in which $\hat{E}_{s,l}$ is an estimate of the modulation symbol energy of the $l^{th}$ multipath component, and $\hat{\theta}_l$ is an estimate of the phase of the pilot signal.

The channel estimate is then multiplied by the reciprocal of the interference energy $N_{t,l}$ associated with the $l^{th}$ multipath component by the third multiplier 146. The interference energy $N_{t,l}$ includes both interference and noise components. The complex conjugate circuit 152 then computes the conjugate of the output of the third multiplier 146, which represents maximal ratio path combining weights. The maximal ratio path combining weights are then multiplied by the corresponding data symbol output from the divider circuit 130 via the fifth multiplier 154. The data symbol d is represented by the following equation:

$$d = \sqrt{\hat{E}_{s,l}} \cdot e^{j\hat{\theta}_l} X_t, \quad [8]$$

in which the variables are as given for equation (2).

The output of the fifth multiplier 154 represents optimally weighted data signals that are then accumulated over the L paths that comprise the signals via the path combiner circuit 156. The resulting optimally combined data signals are provided to the LLR circuit 96, which facilitates the calculation of optimal soft decoder inputs to a decoder (as described in detail below).

The soft decisions on the modulation symbols resulting from the path combining and repeat combining may be denoted $(Y_I, Y_Q)$, with $Y_I$ denoting the in-phase soft decision and $Y_Q$ denoting the quadrature soft decision. The soft decisions $(Y_I, Y_Q)$ are transformed into LLRs on the code symbols by the LLR circuit 96. The LLRs constitute the soft-decision input to the turbo decoder (not shown). As those of skill in the art would understand, the manner in which the soft decisions $(Y_I, Y_Q)$ on the modulation symbols are transformed into LLR metrics on the underlying code symbols, and accordingly, the construction of the LLR circuit 96, is dictated by the modulation scheme employed.

Those skilled in the art would understand that computation of LLR metrics in a Quadrature Phase Shift Keyed (QPSK) modulation scheme is relatively straightforward by comparison to such computations for modulation schemes such as eight-ary phase shift keying (8PSK) and sixteen-ary quadrature amplitude modulation (16QAM). In a QPSK modulation scheme, each complex modulation symbol $(Y_I, Y_Q)$ conveys information about two code symbols, $c_1$ and $c_0$. In fact, the in-phase component $Y_I$ carries all the information about the code symbol $c_0$, while the quadrature component $Y_Q$ carries all the information about the remaining codeword $c_1$. If $(Y_I, Y_Q)$ is normalized in such a way that its mean amplitude is equal to the C/I ratio, the modulation soft decisions $Y_I$ and $Y_Q$ may be transformed into LLR metrics on the code symbols $c_0$ and $c_1$ in accordance with the following equations:

$$LLR(c_0) = 2mt;epmrl;\sqrt{beginbold2endboldrlxmx} Y_I \quad [9]$$

and $$LLR(c_1) = 2mt;epmrl;\sqrt{beginbold2endboldrlxmx} Y_Q \quad [10]$$

Exemplary circuits for computation of LLR metrics in connection with a QPSK modulation scheme are described in U.S. application Ser. No. 09/311,793, filed May 13, 1999, entitled SYSTEM AND METHOD FOR PERFORMING ACCURATE DEMODULATION OF TURBO-ENCODED SIGNALS VIA PILOT ASSISTED COHERENT DEMODULATION, now U.S. Pat. No. 6,377,607, issued Apr. 23, 2002 to Ling et al., and U.S. application Ser. No. 09/310,053, filed May 11, 1999, entitled SYSTEM AND METHOD FOR PROVIDING AN ACCURATE ESTIMATION OF RECEIVED SIGNAL INTERFERENCE FOR USE IN WIRELESS COMMUNICATIONS SYSTEMS, both of which are assigned to the assignee of the present invention and fully incorporated herein by reference.

If an 8PSK modulation scheme is employed, computing the LLR metrics becomes much more difficult. In accordance with one embodiment, the LLR metrics used in connection with an 8PSK modulation scheme with gray code labeling are advantageously estimated. As described above, $(Y_I, Y_Q)$ is normalized in such a way that its mean amplitude is equal to the C/I ratio. Because the modulation scheme is 8PSK, each complex modulation symbol $(Y_I, Y_Q)$ conveys information about three code symbols, $c_2$, $c_1$, and $c_0$. The first code symbol, $c_2$, is the most-significant symbol of a received, 8PSK-modulated codeword conveying information regarding a transmitted bit. The third code symbol, $c_0$, is the least-significant symbol of the received, 8PSK-modulated codeword. Simplified estimates of the LLR metrics on the code symbols $c_2$, $c_1$, and $c_0$ are advantageously obtained from the modulation symbol soft decisions $(Y_I, Y_Q)$ in accordance with the following equations:

$$LLR(c_0) = (|Y_I| - |Y_Q|)(|Y_I| + |Y_Q|) \frac{1.0824}{\sqrt{Y_I^2 + Y_Q^2}} \quad [11]$$

$$LLR(c_1) = 2.6131 Y_I \quad [12]$$

and $$LLR(c_2) = 2.6131 Y_Q \quad [13]$$

Figure 6:
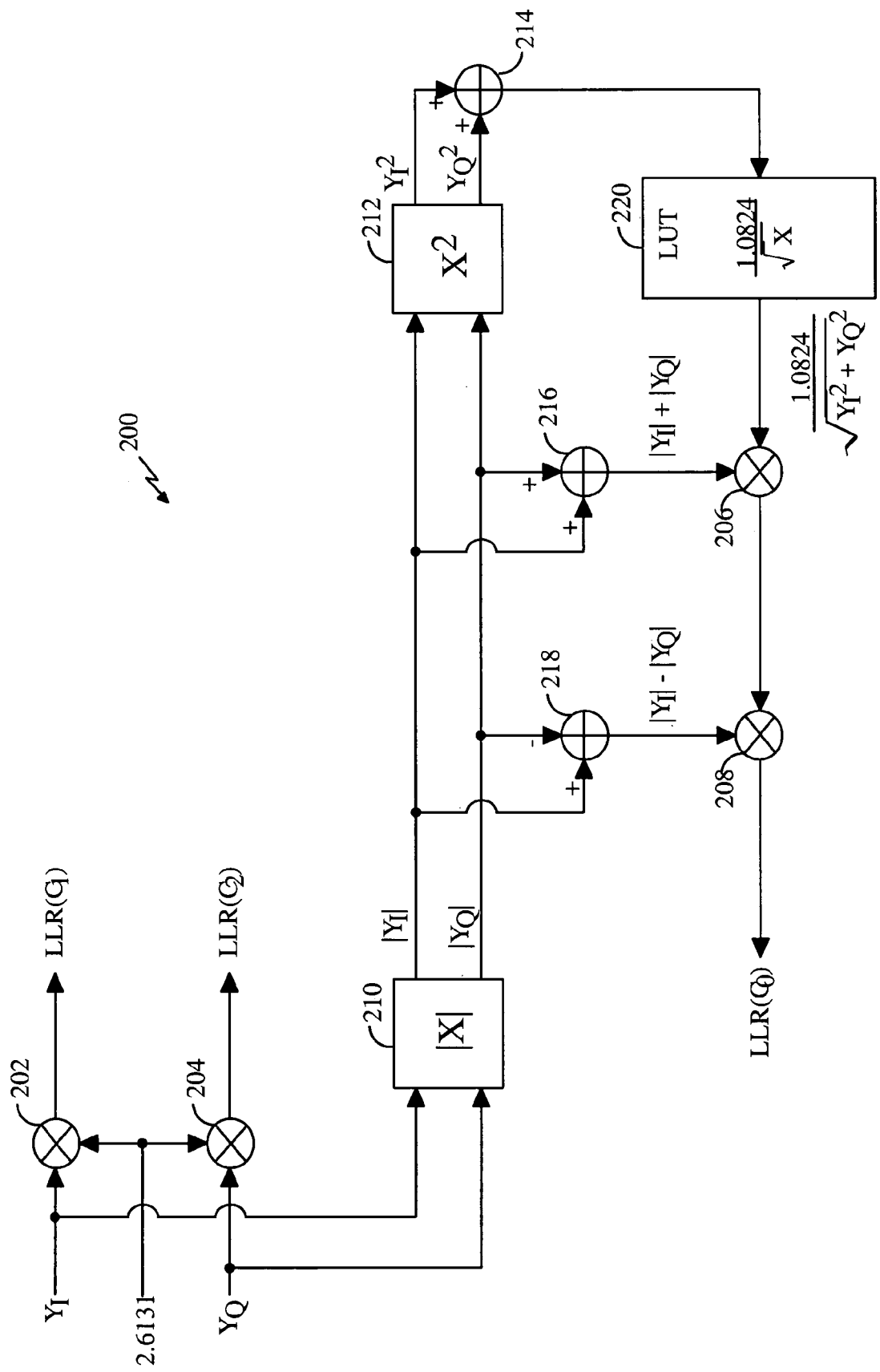
FIG. 6 is a block diagram of an LLR estimation circuit that may be used in the circuit of FIG. 5 in connection with an 8PSK modulation scheme.

In accordance with one embodiment, as shown in FIG. 6, an LLR estimation circuit 200 may be used in place of the LLR circuit 96 in FIG. 5 to provide a simplified estimate of the LLR metrics in connection with an 8PSK modulation scheme with gray code labeling. The LLR estimation circuit 200 includes first, second, third, and fourth multipliers 202, 204, 206, 208, an absolute value circuit 210, a squaring circuit 212, first and second adders 214, 216, a subtractor 218, and an LUT 220. The absolute value circuit 210 is coupled to the squaring circuit 212, the second adder 216, and the subtractor 218. The squaring circuit 212 is coupled to the first adder 214. The first adder 214 is coupled to the LUT 220, which is coupled to the third multiplier 206. The third multiplier 206 is coupled to the fourth multiplier 208. The second adder 216 is coupled to the third multiplier 206, and the subtractor 218 is coupled to the fourth multiplier 208.

In operation, the in-phase component, $Y_I$, of a demodulated soft decision is provided to the first multiplier 202. A constant digital value of 2.6131 is also provided to the first multiplier 202. The first multiplier 202 multiplies the in-phase component $Y_I$ with the digital value 2.6131, generating an LLR metric, $LLR(c_1)$, on the code symbol $c_1$. Those skilled in the art would appreciate that the digital value need not be restricted to precisely 2.6131. Other values could be employed to yield a less accurate estimation of the LLR metric $LLR(c_1)$.

The quadrature component, $Y_Q$, of the demodulated soft decision is provided to the second multiplier 204. The constant digital value of 2.6131 is also provided to the second multiplier 204. The second multiplier 204 multiplies the quadrature component $Y_Q$ with the digital value 2.6131, generating an LLR metric, $LLR(c_2)$, on the code symbol $c_2$. Those skilled in the art would appreciate that the digital value need not be restricted to precisely 2.6131. Other values could be employed to yield a less accurate estimation of the LLR metric $LLR(c_2)$.

The in-phase and quadrature components, $Y_I$ and $Y_Q$, are also provided to the absolute value circuit 210, which generates the absolute values, $|Y_I|$ and $|Y_Q|$, of the components. The absolute values $|Y_I|$, $|Y_Q|$ are provided to the squaring circuit 212, which squares the provided values, generating squared values $Y_I^2$ and $Y_Q^2$. The absolute value circuit 210 and the squaring circuit 212 may be implemented with hardware circuits whose construction would be understood by those of skill in the art. The absolute value circuit 210 and the squaring circuit 212 may also be implemented with a conventional processor or DSP executing a stored set of software or firmware instructions. Or a combination of both implementations may be employed. The squared value $Y_I^2$ is provided to the first adder 214. The squared value $Y_Q^2$ is also provided to the first adder 214. The first adder 214 adds the squared values and provides the sum, $(Y_I^2+Y_Q^2)$, to the LUT 220.

The LUT 220 is advantageously ROM memory configured to store the quotient of 1.0824 and the square root of a value, for a predefined range of values. In the alternative, the LUT 220 could be implemented as any conventional form of nonvolatile storage medium. A conventional processor or DSP (not shown) may be used to access the LUT 220 and/or to perform the operations carried out by the other circuits of the LLR estimation circuit 200. Those of skill would appreciate that numbers other than 1.0824 could be used, with the result being a less accurate estimation of the LLR metric. For example, in a particular embodiment, the LUT 220 stores the quotient of 1 and the square root of a value, for a predefined range of values.

The LUT 220 generates the quotient of 1.0824 and the square root of the sum of the squared components $Y_I^2$ and $Y_Q^2$, and provides the quotient, $1.0824/\sqrt{Y_I^2+Y_Q^2}$, to the third multiplier 206. The absolute values of the components, $|Y_I|$ and $|Y_Q|$, are also provided by the absolute value circuit 210 to the second adder 216. The second adder 216 adds the absolute values $|Y_I|$, $|Y_Q|$ and provides the sum, $|Y_I|+|Y_Q|$, to the third multiplier 206. The third multiplier 206 multiplies the sum $|Y_I|+|Y_Q|$ with the quotient $1.0824/\sqrt{Y_I^2+Y_Q^2}$, and provides the resultant product to the fourth multiplier 208.

The absolute values of the components, $|Y_I|$ and $|Y_Q|$, are also provided by the absolute value circuit 210 to the subtractor 218. The subtractor 218 subtracts the absolute value of the quadrature component, $|Y_Q|$ from the absolute value of the in-phase component, $|Y_I|$, and provides the difference, $|Y_I|-|Y_Q|$, to the fourth multiplier 208. The fourth multiplier 208 multiplies the difference $|Y_I|-|Y_Q|$ with the product provided by the third multiplier 206, generating an LLR metric, $LLR(c_0)$, on the code symbol $c_0$.

If a 16QAM modulation scheme is employed, computing the LLR metrics is also much more difficult than doing so for a QPSK modulation scheme. In accordance with one embodiment, the LLR metrics used in connection with a 16QAM modulation scheme with gray code labeling are advantageously estimated. As described above, $(Y_I, Y_Q)$ is normalized in such a way that its mean amplitude is equal to the C/I ratio. Because the modulation scheme is 16QAM, each complex modulation symbol $(Y_I, Y_Q)$ conveys information about four code symbols, $c_3$, $c_2$, $c_1$, and $c_0$. The first code symbol, $c_3$, is the most-significant symbol of a received, 16QAM-modulated codeword conveying information regarding a transmitted bit. The fourth code symbol, $c_0$, is the least-significant symbol of the received, 16QAM-modulated codeword. The in-phase component $Y_I$ carries all the information about the pair of code symbols $c_1$ and $c_0$, while the quadrature component $Y_Q$ carries all the information about the remaining code symbols $c_3$ and $c_2$. Simplified estimates of the LLR metrics on the code symbols $c_2$, $c_1$, and $c_0$ are advantageously obtained from the modulation symbol soft decisions $(Y_I, Y_Q)$ in accordance with the following equations:

$$LLR(c_0) = 1.2649|Y_I| - 0.8(C/I) \quad [14]$$

$$LLR(c_1) = 1.2649 Y_I \left[1 + \frac{2e^{-0.8(C/I)}}{1+e^{-0.8(C/I)}}\right] \quad [15]$$

$$LLR(c_2) = 1.2649|Y_Q| - 0.8(C/I) \quad [16]$$

and $$LLR(c_3) = 1.2649 Y_Q \left[1 + \frac{2e^{-0.8(C/I)}}{1+e^{-0.8(C/I)}}\right] \quad [17]$$

Equations (15) and (17) may advantageously be simplified by replacing the bracketed term in the equations with the value 1, yielding the following equations for $LLR(c_1)$ and $LLR(c_3)$:

$$LLR(c_1) \approx 1.2649 Y_I \quad [18]$$

and $$LLR(c_3) \approx 1.2649 Y_Q \quad [19]$$

Figure 7:
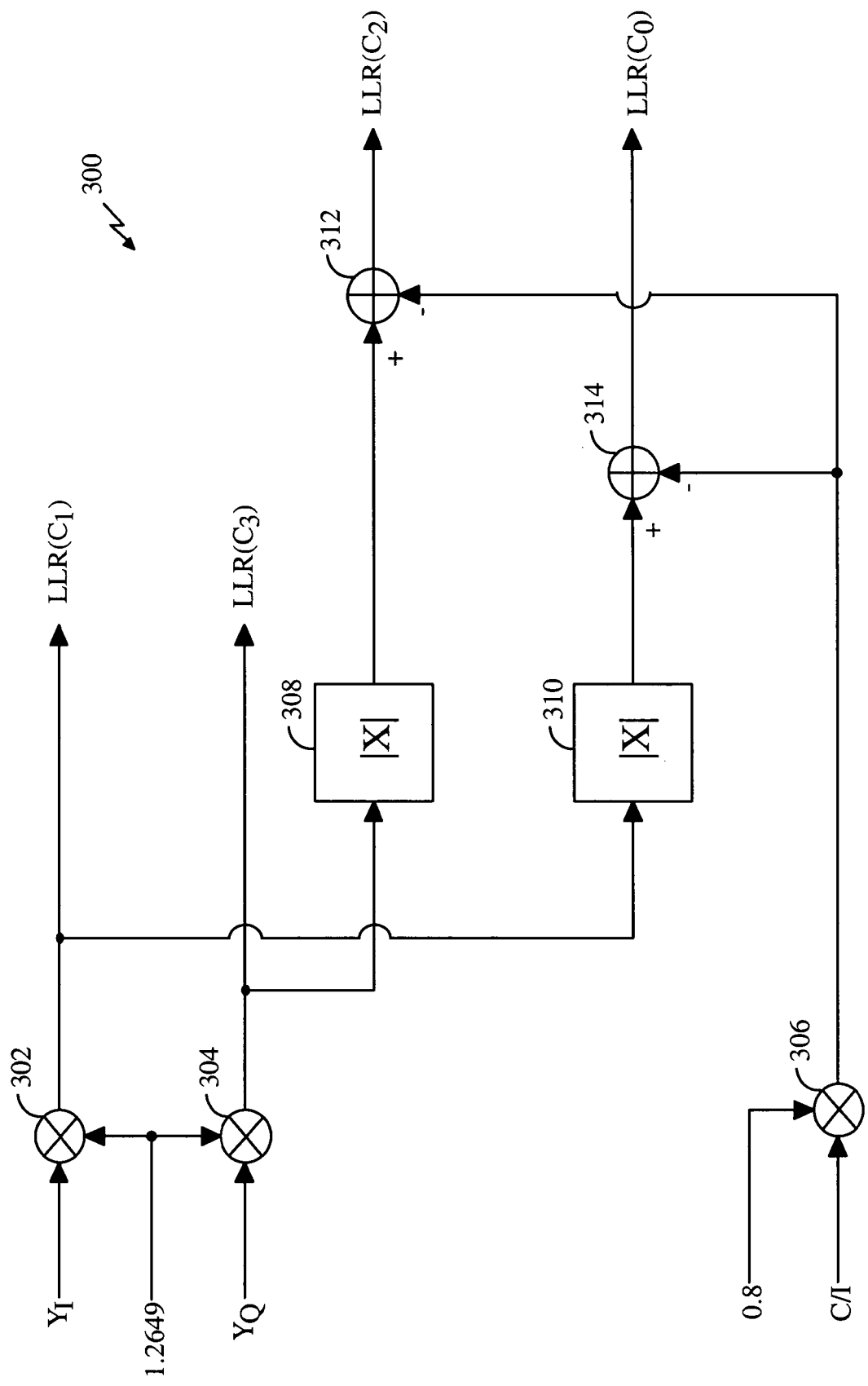
FIG. 7 is a block diagram of an LLR estimation circuit that may be used in the circuit of FIG. 5 in connection with a 16QAM modulation scheme.

In accordance with one embodiment, as shown in FIG. 7, an LLR estimation circuit 300 may be used in place of the LLR circuit 96 in FIG. 5 to provide a simplified estimate of the LLR metrics in connection with a 16QAM modulation scheme with gray code labeling. The LLR estimation circuit 300 includes first, second, and third multipliers 302, 304, 306, first and second absolute value circuits 308, 310, and first and second subtractors 312, 314. The first multiplier 302 is coupled to the second absolute value circuit 310. The second multiplier 304 is coupled to the first absolute value circuit 308. The first absolute value circuit 308 is coupled to the first subtractor 312. The first subtractor 312 is also coupled to the third multiplier 306. The second absolute value circuit is coupled to the second subtractor 314. The second subtractor 314 is also coupled to the third multiplier 306.

In operation, the in-phase component, $Y_I$, of a demodulated soft decision is provided to the first multiplier 302. A constant digital value of 1.2649 is also provided to the first multiplier 302. The first multiplier 302 multiplies the in-phase component $Y_I$ with the digital value 1.2649, generating an LLR metric, $LLR(c_1)$, on the code symbol $c_1$. Those skilled in the art would appreciate that the digital value need not be restricted to precisely 1.2649. Other values could be employed to yield other estimations of the LLR metric $LLR(c_1)$.

The quadrature component, $Y_Q$, of the demodulated soft decision is provided to the second multiplier 304. The constant digital value of 1.2649 is also provided to the second multiplier 304. The second multiplier 304 multiplies the quadrature component $Y_Q$ with the digital value 1.2649, generating an LLR metric, $LLR(c_3)$, on the code symbol $c_3$. Those skilled in the art would appreciate that the digital value need not be restricted to precisely 1.2649. Other values could be employed to yield other estimations of the LLR metric $LLR(c_3)$.

The product output by the first multiplier 302 (i.e., the LLR metric $LLR(c_1)$) is provided to the second absolute value circuit 310. The product output by the second multiplier 304 (i.e., the LLR metric $LLR(c_3)$) is provided to the first absolute value circuit 308. The first absolute value circuit 308 generates the absolute value of the product output by the second multiplier 304, and provides the absolute value to the first subtractor 312. The second absolute value circuit 310 generates the absolute value of the product output by the first multiplier 302, and provides the absolute value to the second subtractor 314. The first and second absolute value circuits 308, 310 may be implemented with hardware circuits whose construction would be understood by those of skill in the art. The absolute value circuits 308, 310 may also be implemented with a conventional processor or DSP executing a stored set of software or firmware instructions. Or a combination of both implementations may be employed.

An estimate of the C/I ratio is provided to the third multiplier 306. A constant digital value of 0.8 is also provided to the third multiplier 306. The third multiplier 306 multiplies the C/I value with the digital value 0.8, and provides the resultant product to the first and second subtractor circuits 312, 314. Those skilled in the art would appreciate that the digital value need not be restricted to precisely 0.8. Other values could be employed to yield less accurate estimations of the LLR metrics.

The first subtractor 312 subtracts the product output by the third multiplier 306 from the absolute value provided by the first absolute value circuit 308, generating an LLR metric, $LLR(c_2)$, on the code symbol $c_2$. The second subtractor 314 subtracts the product output by the third multiplier 306 from the absolute value provided by the second absolute value circuit 310, generating an LLR metric, $LLR(c_0)$, on the code symbol $c_0$.

Reliable communication at high spectral efficiency is achieved with the use of multi-level modulation schemes (such as QAM or MPSK) together with powerful coding techniques (such as turbo codes). The turbo decoding algorithm uses soft decision estimates of the encoder output in order to recover the encoded data. Most implementations of turbo decoders use the LLR on the binary symbols at the encoder output as their soft decision input. Except for the simplest modulation schemes, such as BPSK or QPSK, the extraction of LLRs from the demodulator soft decisions is a computationally complex task. Therefore, in accordance with one embodiment, a simplified procedure is provided for the approximate computation of LLRs from modulation symbol soft decisions for square QAM constellations (such as, e.g., 16QAM, 64QAM, and 256QAM) and MPSK constellations (such as, e.g., 8PSK and 16PSK).

Figure 8:
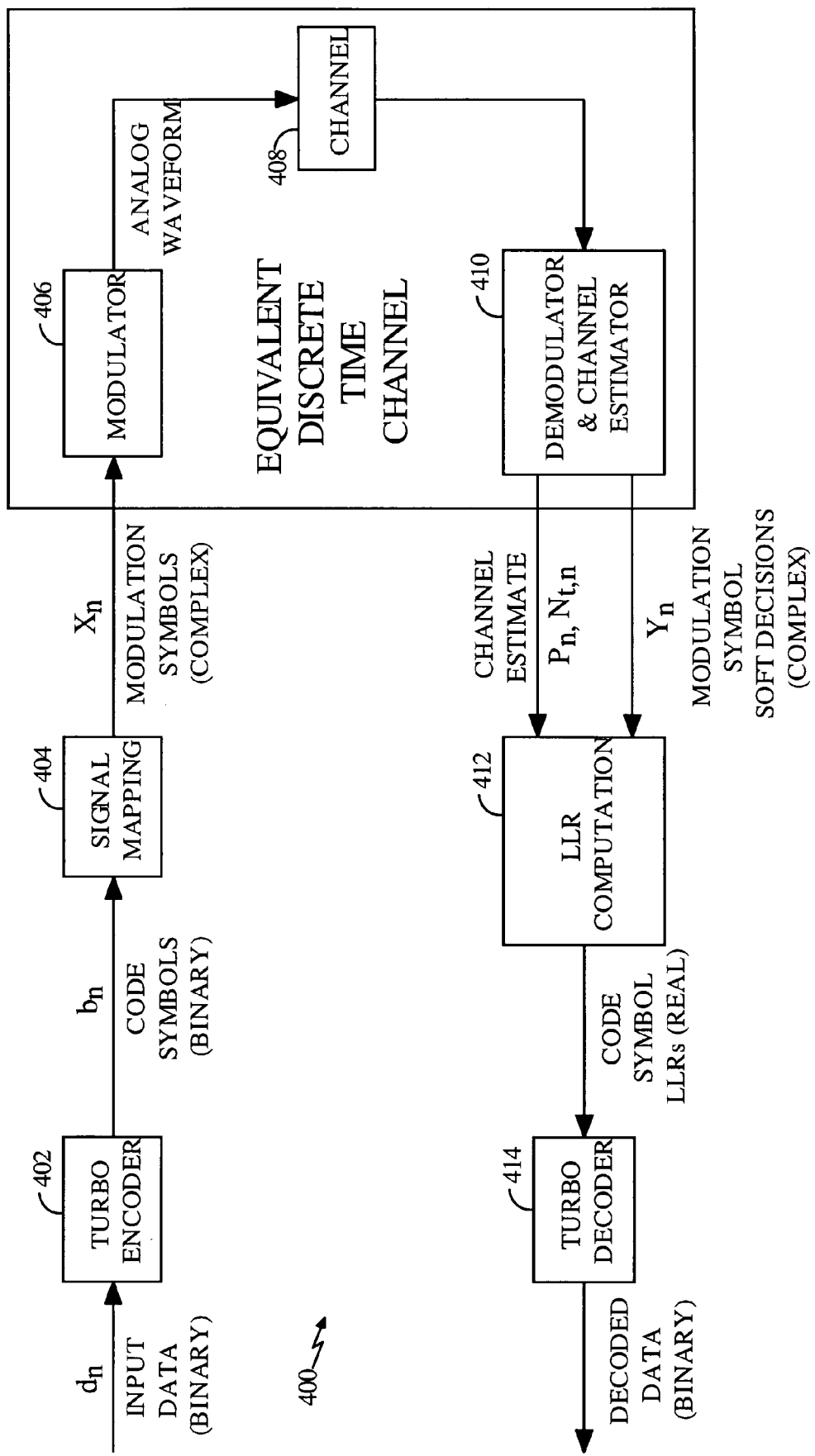
FIG. 8 is a block diagram of a communication system model.

In a typical communication system 400, as illustrated in FIG. 8, binary data $d_n$ to be transmitted is encoded with a turbo code by a turbo encoder 402, which generates a sequence of binary symbols $b_n$ often referred to as code symbols. Several code symbols are blocked together and mapped to a point on a signal constellation by a signal mapping module 404, thereby generating a sequence $x_n$ of complex-valued, modulation symbols. This sequence is applied to a modulator 406, which generates a continuous-time waveform, which is transmitted over a channel 408.

At a receiver (not shown), a demodulator 410 uses the output to generate a sequence of complex-valued soft decisions $y_n$. Each soft decision represents an estimate of a modulation symbol that was transmitted over the channel 408. This estimate is used by an LLR computation module 412 to extract the LLR of the code symbols associated with the given modulation symbols. A turbo decoder 414 uses the sequence of code symbol LLRs to decode the binary data that was originally transmitted.

In one embodiment a square QAM signal constellation and a rule for assigning a block of binary (code) symbols to each point on a signal constellation are defined. The square QAM constellation with index m is defined to be a signal constellation with $4^m$ points, which may be regarded as the Cartesian product of two pulse amplitude modulated (PAM) constellations with $2^m$ points. Each signal point is denoted by its index (i,j), where $0 \leq i,j < 2^m$. The position of the $(i,j)^{th}$ point on the signal constellation is given by $$c_{i,j} = \{(2^m-1-2i)\Delta, (2^m-1-2j)\Delta\}$$

where $$\Delta = \sqrt{\frac{3}{4^m-1} \cdot \left(\frac{1}{2}\right)}.$$

The above definition ensures that the average energy (i.e., the squared Euclidean norm) of the signal constellation is normalized to 1. Table 1, below, shows the value of the normalizing parameter $\Delta$ for various square QAM constellations.

TABLE 1

Energy normalization for various square QAM constellations

| M | Constellation | $\Delta$ |
|---|---|---|
| 1 | 4-QAM (QPSK) | $1/\sqrt{2}$ |
| 2 | 16-QAM | $1/\sqrt{10}$ |
| 3 | 64-QAM | $1/\sqrt{42}$ |
| 4 | 256-QAM | $1/\sqrt{170}$ |

Each signal point is labeled with a binary string that denotes a block of code symbol values associated with the modulation symbol. In a particular embodiment, gray code mapping is used to associate the modulation symbols with blocks of code symbols. Gray code mapping is well known to those of skill in the art. It should be understood that other forms of mapping may be employed. In accordance with the gray code mapping, the label of the $(i,j)^{th}$ point on the constellation is given by $$l_{i,j} = b_{2m-2}b_{2m-2}b_{2m-3}\ldots b_{m+2}b_{m+1}b_m b_{m-1}b_{m-2}b_{m-3} \ldots b_2 b_1 b_0,$$

where $b_k = 0,1;$ $$\sum_{k=0}^{m-1} b_k \cdot 2^k = \text{gray}(i),$$

$$\sum_{k=0}^{m-1} b_{m+k} \cdot 2^k = \text{gray}(j).$$

The function gray(i) represents the well known gray-code mapping, with $\text{gray}(0)=0$, $\text{gray}(1)=1$, $\text{gray}(2)=(11)_2=3$, $\text{gray}(3)=(10)_2=2$, $\text{gray}(4)=(110)_2=6$, etc. More formally, the gray code mapping may be defined as follows:

$\text{gray}(0)=0$, $\text{gray}(1)=1$, $\text{gray}(k)=2^{n-1}+\text{gray}(2^n-1-k)$, for $2^{n-1} \leq k < 2^n$ The values $b_k(i,j)=0,1$ are used to denote the $k^{th}$ component of the label $l_{i,j}$.

Figure 9:
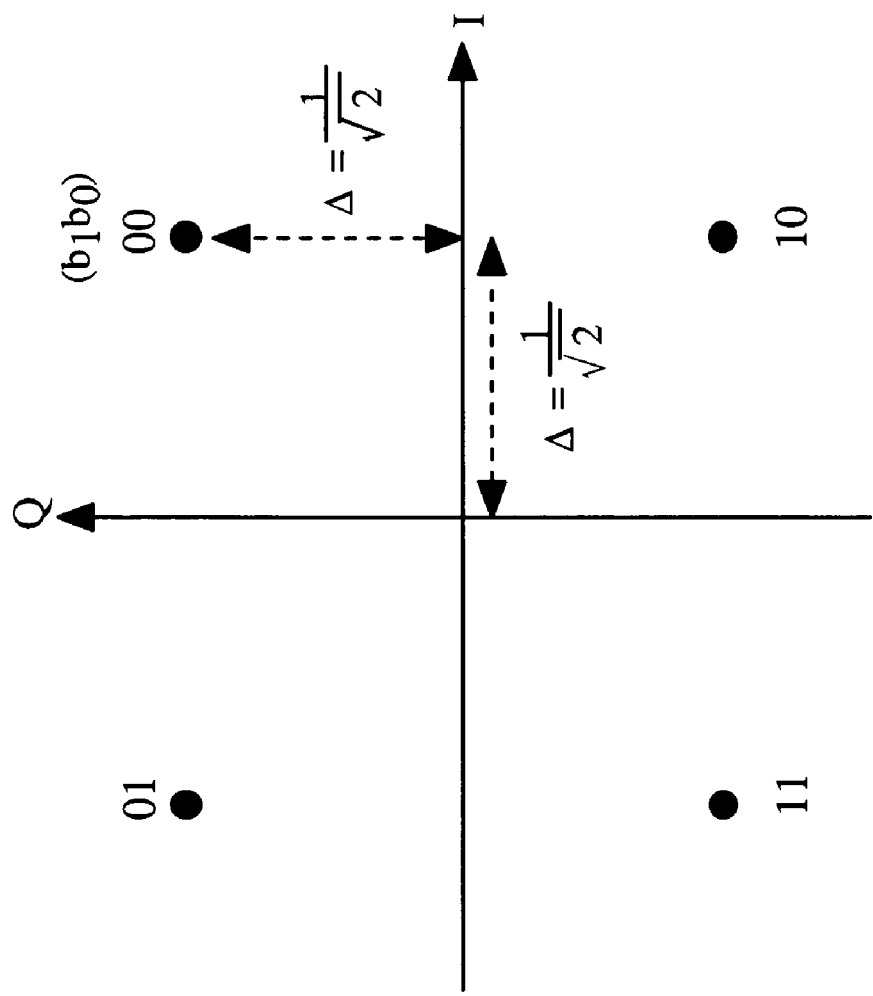
FIG. 9 is a diagram of a 4QAM (QPSK) signal constellation mapping with gray code labeling.
Figure 10:
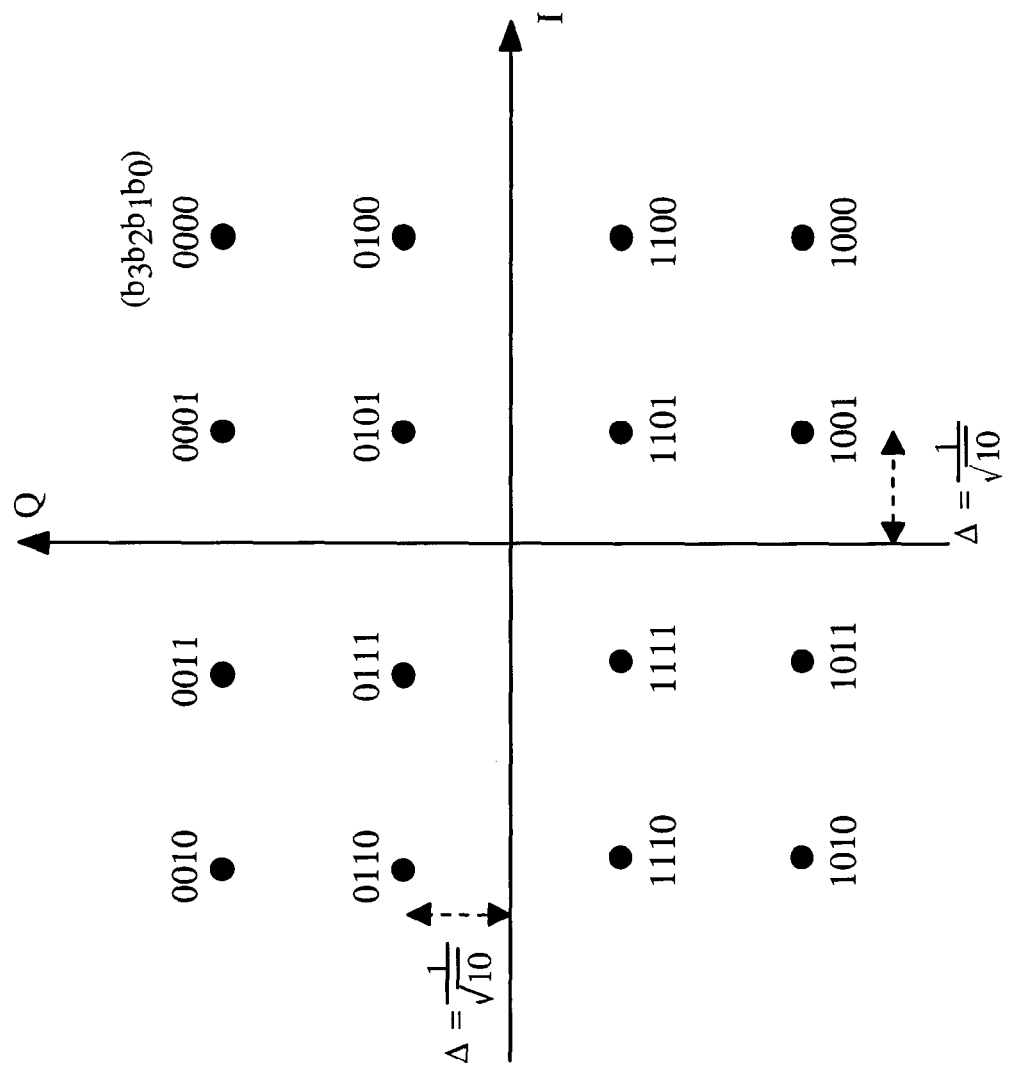
FIG. 10 is a diagram of a 16QAM signal constellation mapping with gray code labeling.
Figure 11:
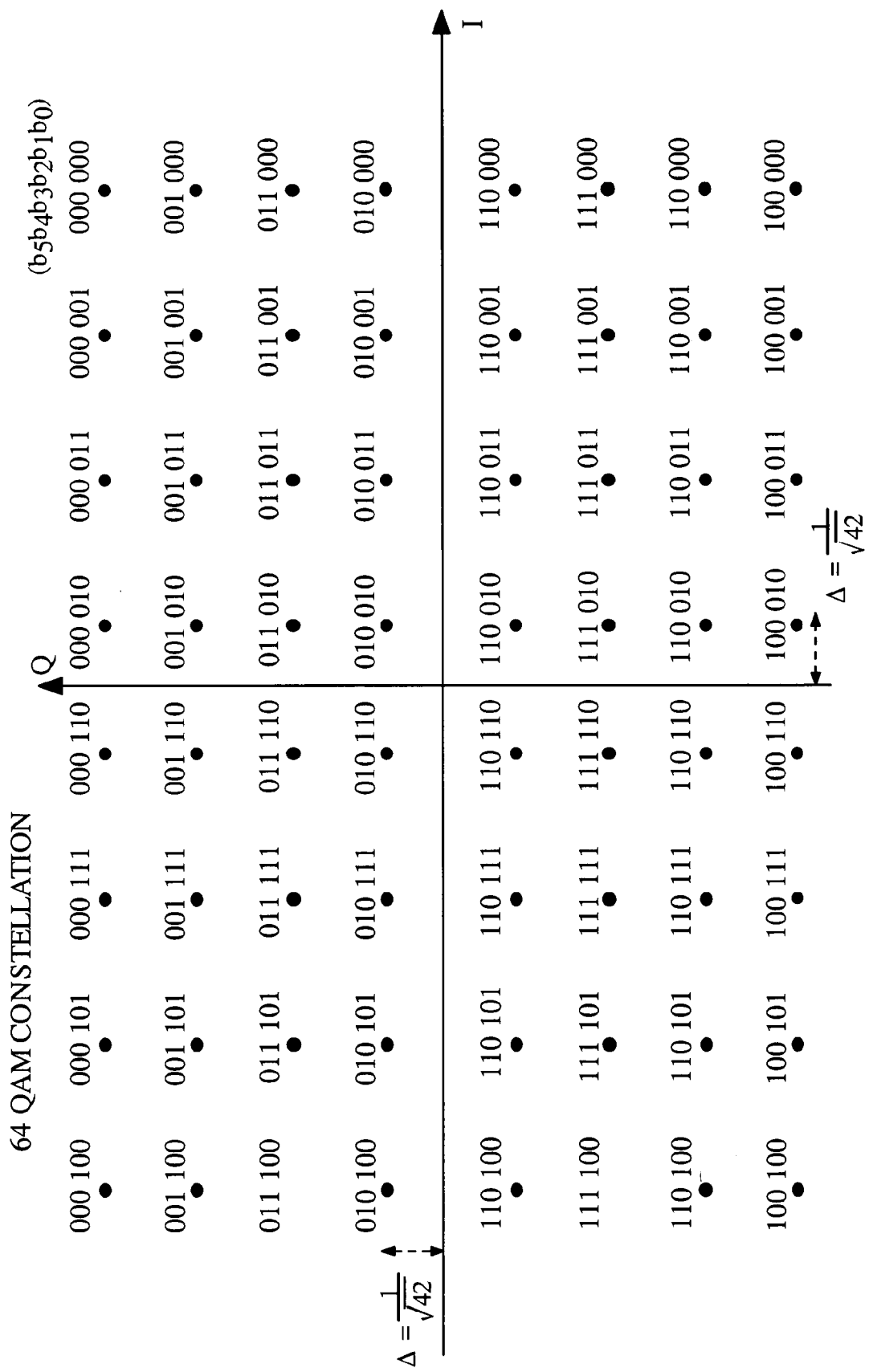
FIG. 11 is a diagram of a 64QAM signal constellation mapping with gray code labeling.

The above-described signal constellation for m=1 is depicted in FIG. 9. The above-described signal constellation for m=2 is depicted in FIG. 10. The above-described signal constellation for m=3 is depicted in FIG. 11.

In one embodiment a Multiple Phase Shift Keying (MPSK) signal constellation and a rule for assigning a block of binary (code) symbols to each point on the signal constellation are defined. An MPSK constellation with index m (also commonly referred to as a $2^m$-PSK constellation) is defined to be a signal constellation with $2^m$ points located on the unit circle. Each signal point is denoted by its index i, where $0 \leq i < 2^m$. The position of the $i^{th}$ point on the signal constellation is given by:

$$c_i = \left[\cos\left\{\frac{\pi(2i+1)}{2^m}\right\}, \sin\left\{\frac{\pi(2i+1)}{2^m}\right\}\right] \equiv e^{j\frac{\pi(2i+1)}{2^m}}$$

Each signal point is labeled with a binary string that denotes a block of code symbol values associated with the modulation symbol. In a particular embodiment, gray code mapping is used to associate the modulation symbols with blocks of code symbols. It should be understood that other forms of mapping may be substituted for gray code mapping. In accordance with gray code mapping, the label of the $i^{th}$ point on the constellation is given by $$l_i = b_{m-1}b_{m-2}b_{m-3} \ldots b_2b_1b_0,$$

where $$b_k = 0,1;$$

$$\sum_{k=0}^{m-1} b_k \cdot 2^k = \text{gray}(i).$$

Figure 12:
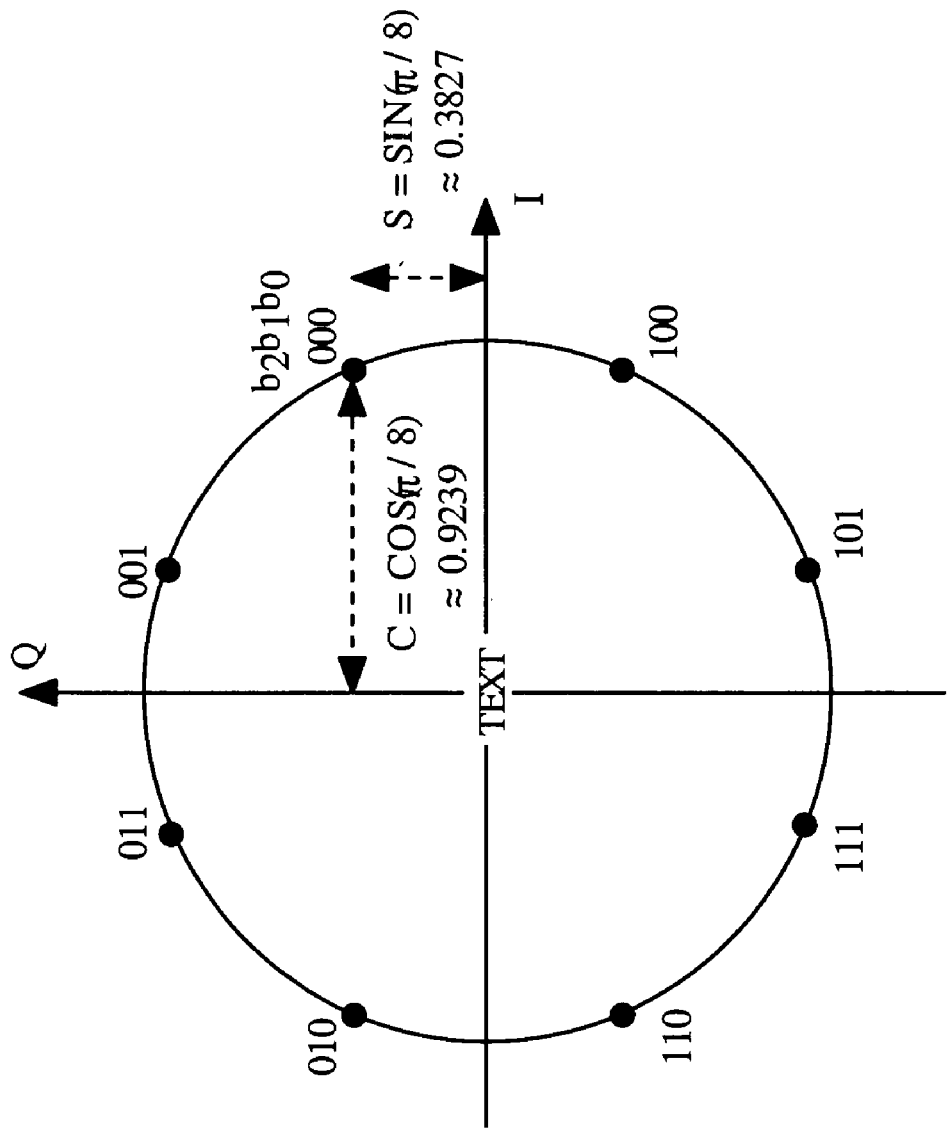
FIG. 12 is a diagram of an 8PSK signal constellation mapping with gray code labeling.
Figure 13:
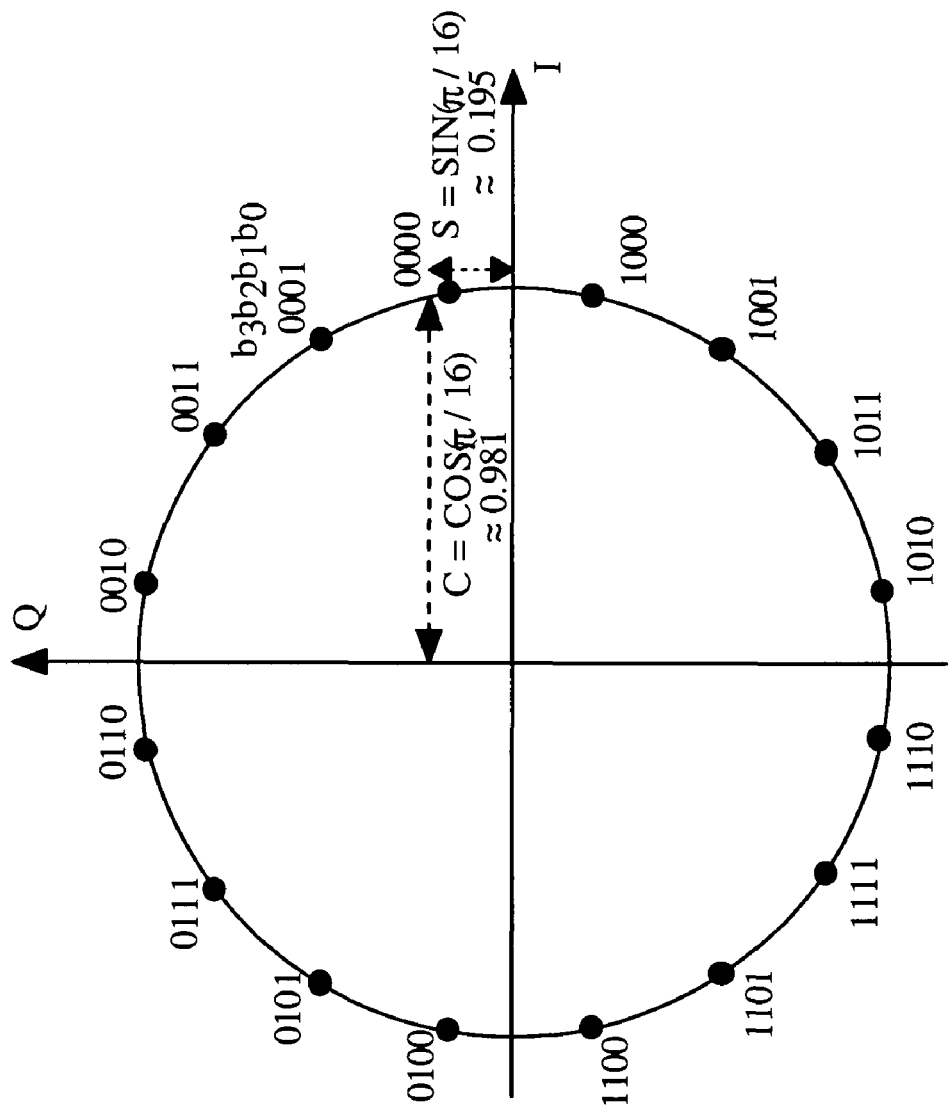
FIG. 13 is a diagram of a 16PSK signal constellation mapping with gray code labeling.

For m=1, the $2^m$-PSK constellation is the well known BPSK signal set. For m=2, the $2^m$-PSK constellation coincides with the 4QAM constellation shown in FIG. 9, and is more commonly known as a QPSK constellation. The $2^m$-PSK signal constellation for m=3 is depicted in FIG. 12. The $2^m$-PSK signal constellation for m=4 is depicted in FIG. 13.

In one embodiment binary data at the input of a transmitter is encoded and mapped to points on a signal constellation. Hence, the signal at the channel input may advantageously be modeled by a sequence of modulation symbols $x = x_1 x_2 x_3 \ldots$ drawn from a normalized square QAM constellation. The channel output is given by a sequence $y = y_1 y_2 y_3 \ldots$, with $$y_n = \sqrt{E_n} e^{j\theta_n} x_n + w_n,$$

where $E_n$ represents the average modulation signal energy at the receiver, determined by the channel gain over the $n^{th}$ symbol duration; $\theta_n$ represents the phase shift introduced by the channel over the $n^{th}$ symbol duration; and $w_n$ represents the complex-valued additive Gaussian noise (and pseudo-random (PN) interference) introduced by the channel, other users, multi-path signals, etc., with zero mean and variance $E[|w_n|^2] = N_{t,n}$.

It is assumed that the receiver has the knowledge of the complex channel gain $P_n = \sqrt{E_n} e^{j\theta_n}$ and the noise variance $N_{t,n}$ both of which may be estimated by transmitting a pilot signal along with data. The receiver computes the maximal ratio dot product to generate the decision variable $$Z_n = \frac{y_n \cdot P_n^*}{N_{t,n}} = \frac{E_n}{N_{t,n}} \cdot x_n + \frac{\sqrt{E_n}}{N_{t,n}} e^{-j\theta_n} \cdot w_n$$

The above equation yields the following equation:

$$E[Z_n | x_n] = \frac{E_n}{N_{t,n}} \cdot x_n, \text{Var}[Z_n | x_n] = \frac{E_n}{N_{t,n}},$$

$$SNR[Z_n | x_n] = \frac{|E[Z_n | x_n]|^2}{\text{Var}[Z_n | x_n]} = \frac{E_n}{N_{t,n}} \cdot |x_n|^2$$

Stated another way, $$\frac{SNR[Z_n | x_n]}{|x_n|^2} = \frac{E[Z_n | x_n]}{x_n} = \text{Var}[Z_n | x_n] = \frac{E_n}{N_{t,n}}.$$

If several independent copies of the channel output are available at the receiver (i.e., through temporal (repetition), spatial (antenna), or frequency (multi-path) diversity), the individual maximal ratio dot products may be summed together to obtain the decision variable that maximizes the detection signal-to-noise ratio (SNR). The maximum possible detection SNR for a diversity receiver is the sum of the SNRs associated with the individual maximal ratio dot products:

$$Z_n = \sum_{l=1}^{L} Z_{n,l} = \sum_{l=1}^{L} \frac{y_{n,l} \cdot P_{n,l}^*}{N_{t,n,l}},$$

$$\frac{SNR[Z_n | x_n]}{|x_n|^2} = \frac{E[Z_n | x_n]}{x_n} = \text{Var}[Z_n | x_n]$$

$$= \sum_{l=1}^{L} \frac{E_{n,l}}{N_{t,n,l}} \equiv S.$$

The decision variable $Z_n$ may be regarded as the soft decision estimate of $x_n$, generated by the demodulator.

In one embodiment LLR computation for square QAM constellations is performed. Each modulation symbol represents a particular string of code symbol values, defined by its labeling. Assuming that all modulation symbols are equally likely, the LLR associated with a given code symbol $b_k$, where $0 \leq k < 2m$, is given by:

$$LLR(b_k) = \ln\left[\frac{\Pr(b_k = 0 | Z_n)}{\Pr(b_k = 1 | Z_n)}\right]$$

$$= \ln\left[\frac{\sum_{i,j: b_k(i,j)=0} \Pr(x_n = c_{i,j} | Z_n)}{\sum_{i,j: b_k(i,j)=1} \Pr(x_n = c_{i,j} | Z_n)}\right]$$

$$= \ln\left[\frac{\sum_{i,j: b_k(i,j)=0} \Pr(Z_n | x_n = c_{i,j})}{\sum_{i,j: b_k(i,j)=1} \Pr(Z_n | x_n = c_{i,j})}\right]$$

$$= \ln\left[\frac{\sum_{i,j: b_k(i,j)=0} e^{-\frac{|Z_n - S c_{i,j}|^2}{S}}}{\sum_{i,j: b_k(i,j)=1} e^{-\frac{|Z_n - S c_{i,j}|^2}{S}}}\right]$$

-continued $$= \ln\left[\frac{\sum_{i,j: b_k(i,j)=0} e^{Z_n c_{i,j}^* + Z_n^* c_{i,j} - S|c_{i,j}|^2}}{\sum_{i,j: b_k(i,j)=1} e^{Z_n c_{i,j}^* + Z_n^* c_{i,j} - S|c_{i,j}|^2}}\right]$$

Advantageously, certain simplifications result from the product symmetry of the square QAM signal constellation and the gray code labeling function. In particular, it should be noted that the position $c_{i,j}$ of the $(i,j)^{th}$ point may be written as $c_{i,j} = a_i + ia_j$, where $a_i = (2^m - 1 - 2i) \cdot \Delta$. Also, the value of a code symbol $b_k(i, j)$ depends only on i if k<m, and only on j otherwise. Hence, the above expression may be simplified as follows:

$$LLR(b_k) = \ln\left[\frac{\sum_{i: b_k(i)=0} e^{-\frac{(\text{Re}[Z_n]-Sa_i)^2}{S}}}{\sum_{i: b_k(i)=1} e^{-\frac{(\text{Re}[Z_n]-Sa_i)^2}{S}}}\right]$$

$$= \ln\left[\frac{\sum_{i: b_k(i)=0} e^{2\text{Re}[Z_n]\cdot a_i - S|a_i|^2}}{\sum_{i: b_k(i)=1} e^{2\text{Re}[Z_n]\cdot a_i - S|a_i|^2}}\right]$$

$$\equiv LLR_k(\text{Re}[Z_n]), \ 0 \le k < m$$

$$LLR(b_k) = \ln\left[\frac{\sum_{j: b_k(j)=0} e^{-\frac{(\text{Im}[Z_n]-Sa_j)^2}{S}}}{\sum_{j: b_k(j)=1} e^{-\frac{(\text{Im}[Z_n]-Sa_j)^2}{S}}}\right]$$

$$= \ln\left[\frac{\sum_{j: b_k(j)=0} e^{2\text{Im}[Z_n]\cdot a_j - S|a_j|^2}}{\sum_{j: b_k(j)=1} e^{2\text{Im}[Z_n]\cdot a_j - S|a_j|^2}}\right]$$

$$= LLR_{k-m}(\text{Im}[Z_n]), \ m \le k < 2m$$

In view of the above symmetry, it is sufficient to address the problem of computing the LLRs for code symbols $b_k$, with $0 \le k < m$. For the 4QAM (QPSK) constellation, the computation simplifies to the well known expressions $LLR(b_o) = 4 \cdot Re[Z_n] \cdot a_o = 2mt;epmrl;$
$\sqrt{beginbold2endboldrlxmx} \cdot Re[Z_n], LLR(b_o) = 4 \cdot Im[Z_n] \cdot b_o = 2mt;epmrl; \sqrt{beginbold2endboldrlxmxIm}[Z_n]$.

Figure 14:
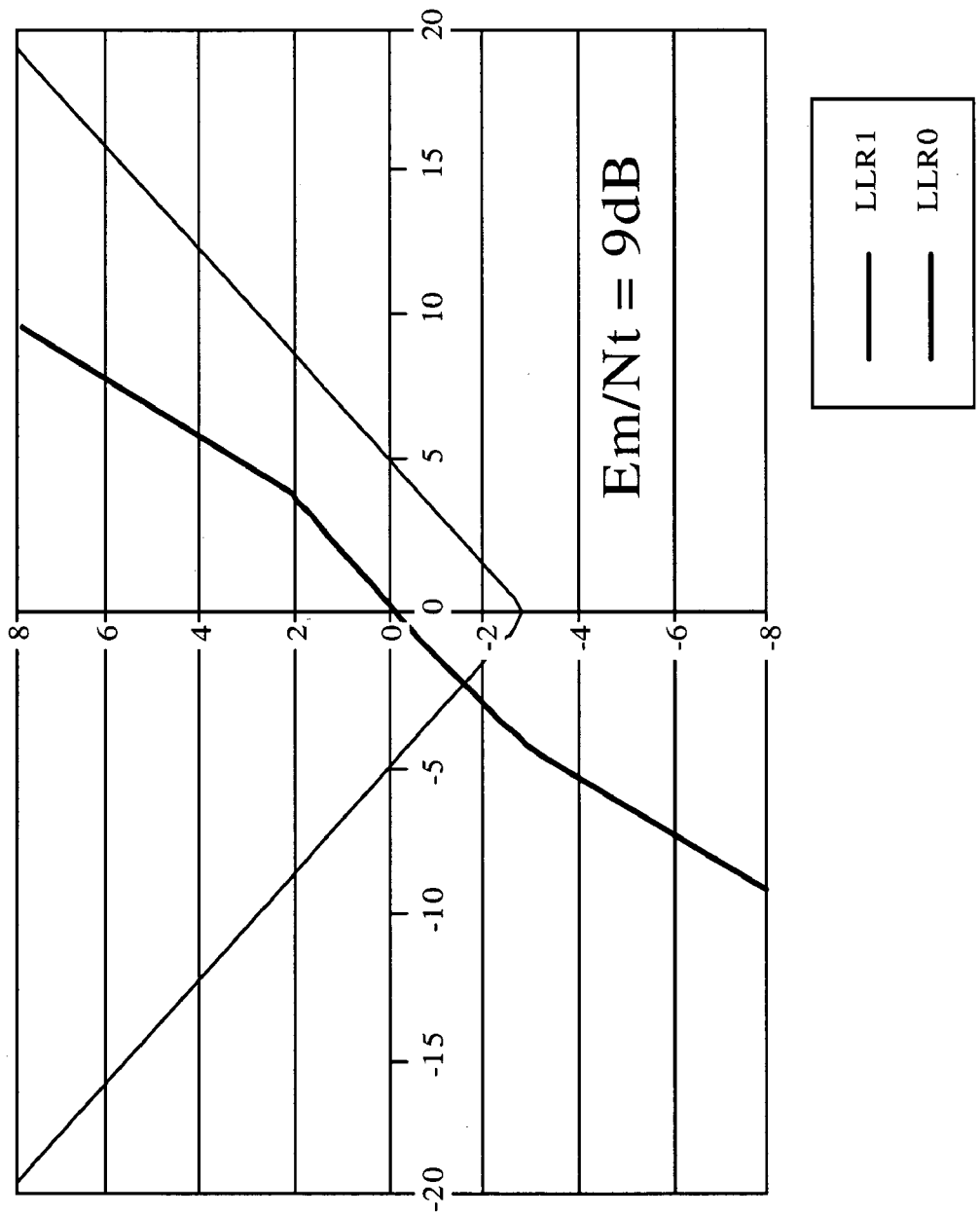
FIG. 14 is a graph of 16QAM code symbol LLRs versus modulation symbol metric.
Figure 15:
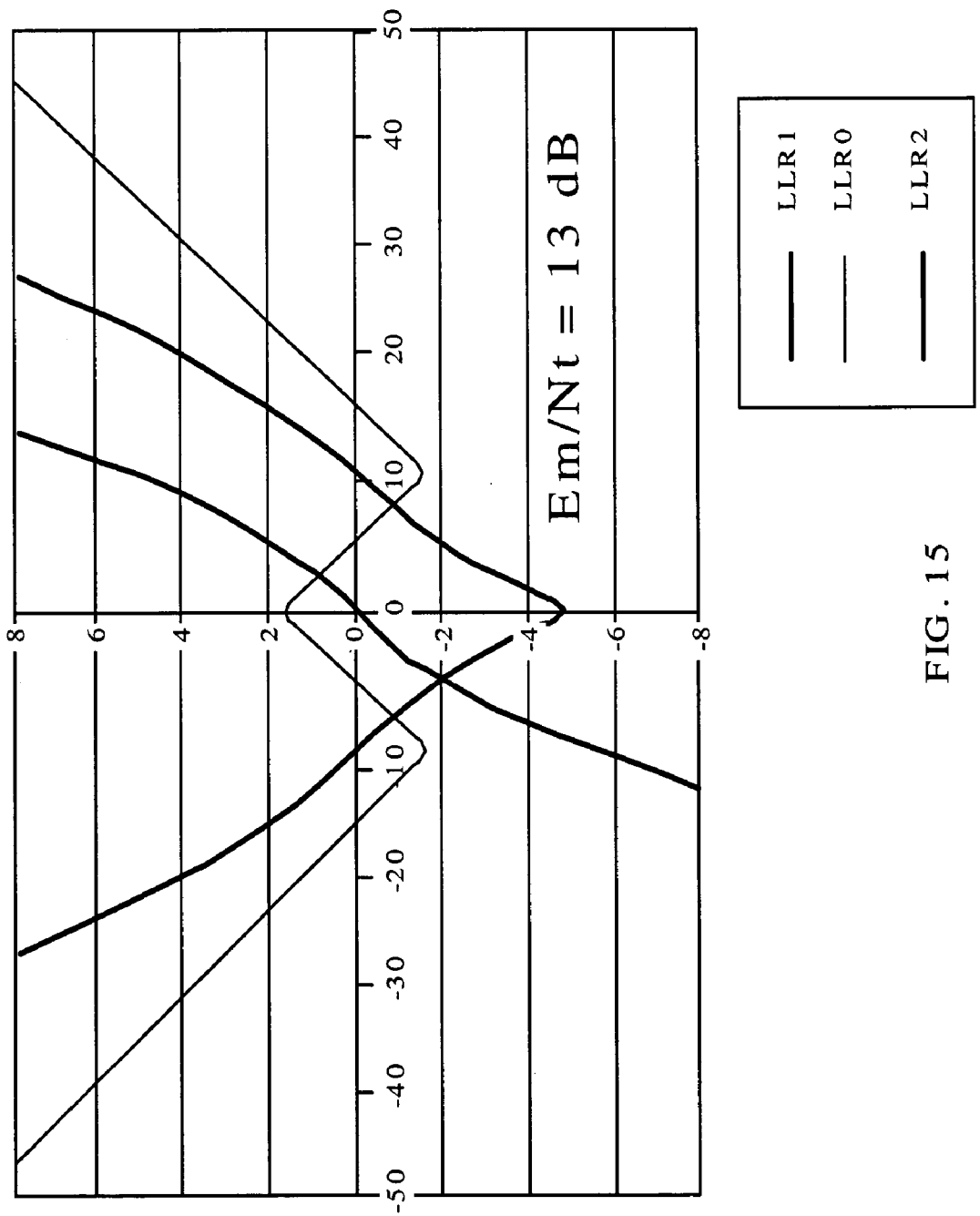
FIG. 15 is a graph of 64QAM code symbol LLRs versus modulation symbol metric.
Figure 16:
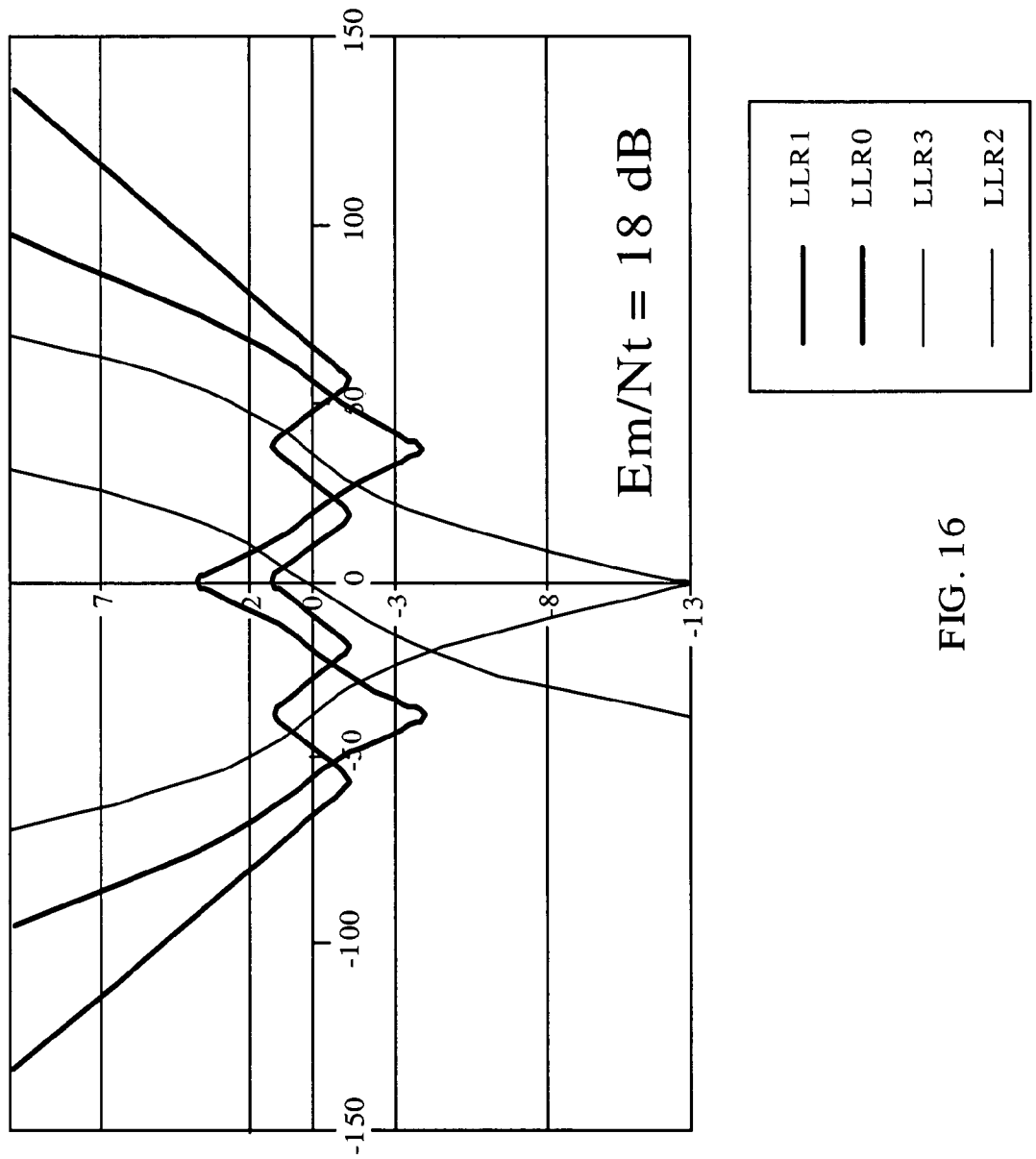
FIG. 16 is a graph of 256QAM code symbol LLRs versus modulation symbol metric.

In FIGS. 14, 15, and 16 graphs of the LLRs associated with various code symbols are plotted for, respectively, 16QAM, 64QAM, and 256QAM constellations with gray code labeling at reasonable operating SNRs, as understood by those skilled in the art.

In one embodiment LLR computation for $2^m$-PSK constellations is performed. Each modulation symbol represents a particular string of code symbol values, defined by its labeling. Assuming that all modulation symbols are equally likely, the LLR associated with a given code symbol $b_k$, where $0 \le k < m$, is given by:

$$LLR(b_k) = \ln\left[\frac{\Pr(b_k=0 \mid Z_n)}{\Pr(b_k=1 \mid Z_n)}\right]$$

$$= \ln\left[\frac{\sum_{i: b_k(i)=0} \Pr(x_n = c_i \mid Z_n)}{\sum_{i: b_k(i)=1} \Pr(x_n = c_i \mid Z_n)}\right]$$

$$= \ln\left[\frac{\sum_{i: b_k(i)=0} \Pr(Z_n \mid x_n = c_i)}{\sum_{i: b_k(i)=1} \Pr(Z_n \mid x_n = c_i)}\right]$$

$$= \ln\left[\frac{\sum_{i: b_k(i)=0} e^{-\frac{|Z_n-Sc_i|^2}{S}}}{\sum_{i: b_k(i)=1} e^{-\frac{|Z_n-Sc_i|^2}{S}}}\right]$$

$$= \ln\left[\frac{\sum_{i: b_k(i)=0} e^{Z_n c_i^* + Z_n^* c_i - S|c_i|^2}}{\sum_{i: b_k(i)=1} e^{Z_n c_i^* + Z_n^* c_i - S|c_i|^2}}\right]$$

$$= \ln\left[\frac{\sum_{i: b_k(i)=0} e^{Z_n c_i^* + Z_n^* c_i}}{\sum_{i: b_k(i)=1} e^{Z_n c_i^* + Z_n^* c_i}}\right]$$

The final simplification in the above equations results from the fact that $|c_i|^2 = 1$ for any point on the MPSK constellation. As a result, the code symbol LLRs do not depend on the normalized SNR S. If the modulation symbol soft decisions are expressed in the polar form $Z_n = R_n e^{j\theta_n}$, the above equations may be rewritten as follows:

$$LLR(b_k) = \ln\left[\frac{\sum_{i: b_k(i)=0} e^{Z_n c_i^* + Z_n^* c_i}}{\sum_{i: b_k(i)=1} e^{Z_n c_i^* + Z_n^* c_i}}\right]$$

$$= \ln\left[\frac{\sum_{i: b_k(i)=0} e^{2R_n \cos\left(\theta_n - \frac{\pi}{2^m}(2i+1)\right)}}{\sum_{i: b_k(i)=1} e^{2R_n \cos\left(\theta_n - \frac{\pi}{2^m}(2i+1)\right)}}\right]$$

Figure 17:
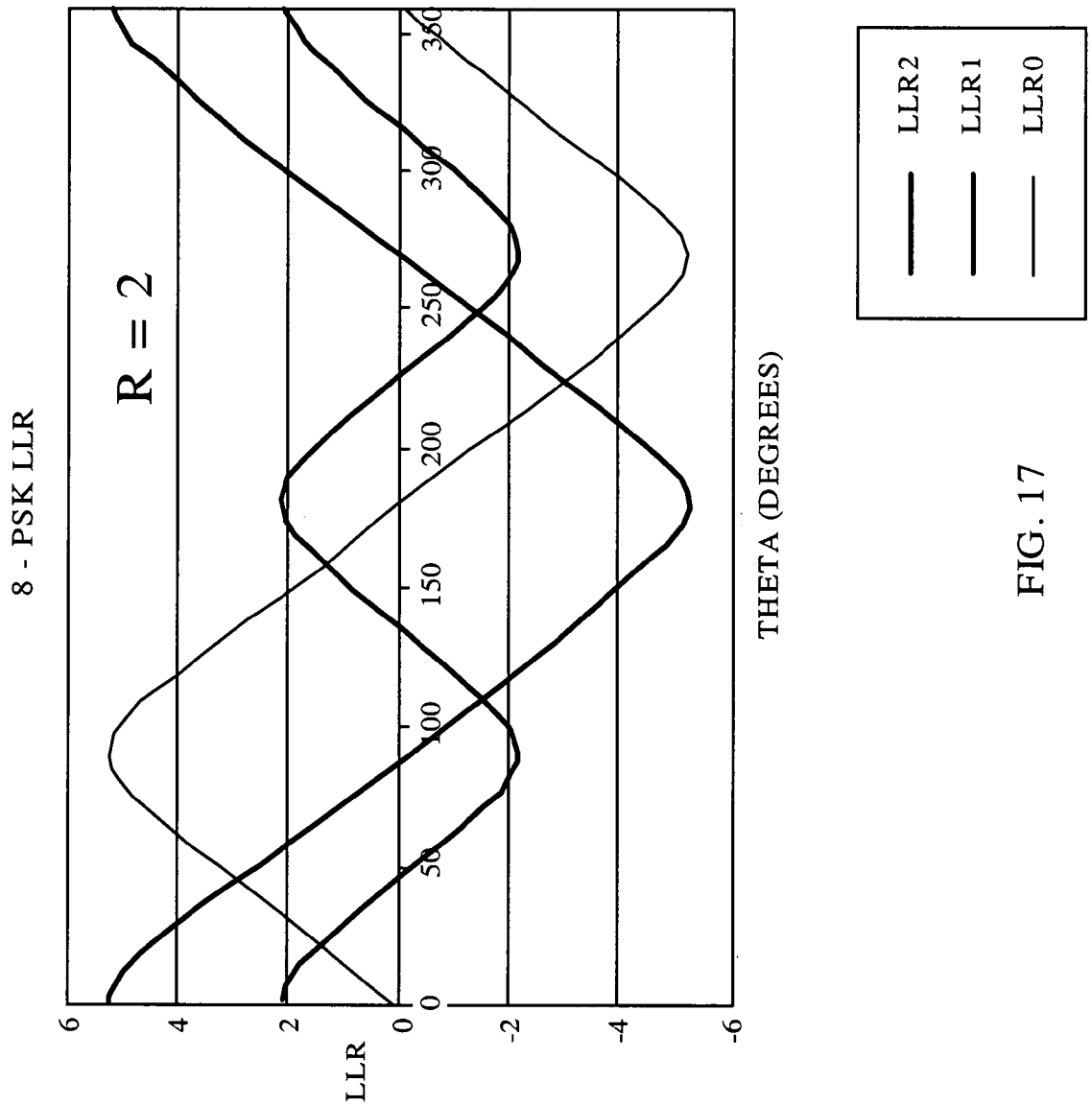
FIG. 17 is a graph of 8PSK code symbol LLRs versus modulation symbol metric.
Figure 18:
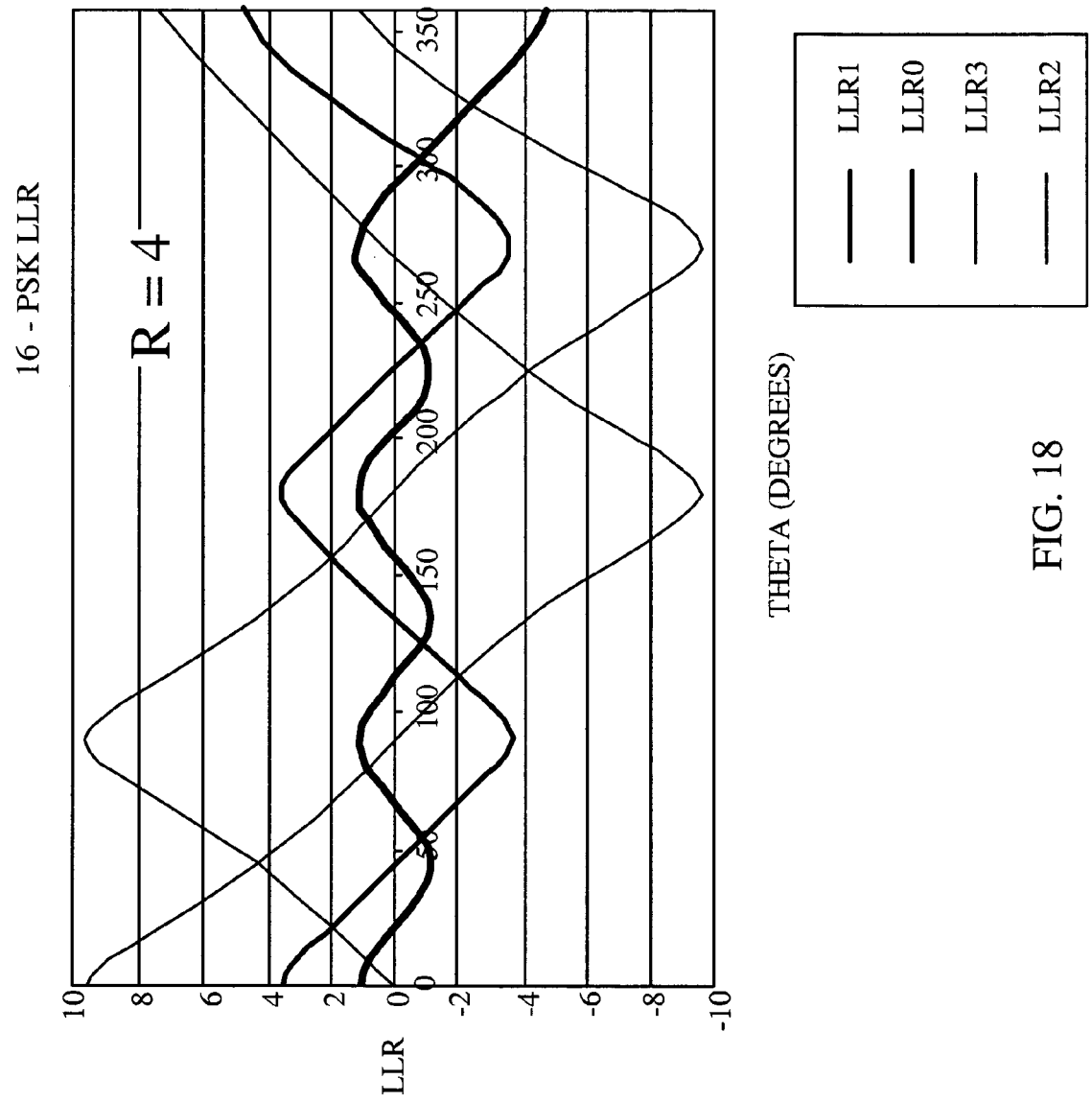
FIG. 18 is a graph of 16PSK code symbol LLRs versus modulation symbol metric.

FIGS. 17 and 18 depict the code symbol LLRs for 8PSK and 16PSK constellations, respectively. In the graphs of FIGS. 17 and 18, the magnitude of the soft decision is held constant, and the angle is varied from 0 to 360 degrees.

In one embodiment a piece-wise linear approximation for the LLR associated with each code symbol is performed for a square QAM constellation. From FIGS. 14–16 it may be seen that for any $4^m$-QAM constellation with m>0, the function $LLR_{m-1}(x)$ is an odd function of x, and may be approximated by a straight line whose slope coincides with the slope of $LLR_{m-1}(x)$ at x=0. Accordingly, $$LLR_{m-1}(x) \approx \left[\frac{d}{dx} LLR_{m-1}(x)\bigg|_{x=0}\right] \cdot x.$$

It may be seen that $$\frac{d}{dx}LLR_{m-1}(x)\bigg|_{x=0} = 4\frac{\sum_{i=0}^{2^{m-1}-1} a_i e^{-S\alpha_i^2}}{\sum_{i=0}^{2^{m-1}-1} e^{-S\alpha_i^2}}$$

$$= 4\Delta \frac{\sum_{i=0}^{2^{m-1}-1}(2^m - 1 - 2i)e^{-S(2^m-1-2i)^2\Delta^2}}{\sum_{i=0}^{2^{m-1}-1} e^{-S(2^m-1-2i)^2\Delta^2}}$$

$$= 4\Delta \frac{\sum_{i=0}^{2^{m-1}-1}(2i+1)e^{-S(2i+1)^2\Delta^2}}{\sum_{i=0}^{2^{m-1}-1} e^{-S(2i+1)^2\Delta^2}}$$

$$\approx 4\Delta \quad \text{for large } S.$$

The following equation may be obtained by substituting specific values of m:

$$\frac{d}{dx}LLR_{m-1}(x)\bigg|_{x=0} = 4\Delta = 2\sqrt{2} \quad \text{if } m=1 \text{ (4-QAM/QPSK)}$$

$$= 4\Delta\frac{1+3e^{-8S\Delta^2}}{1+e^{-8S\Delta^2}} = \frac{4}{\sqrt{10}}\frac{1+3e^{-0.8S}}{1+e^{-0.8S}}$$

$$\approx \frac{4}{\sqrt{10}} \quad \text{if } m=2 \text{ (16-QAM)}$$

$$= 4\Delta\frac{1+3e^{-8S\Delta^2}+5e^{-24S\Delta^2}+7e^{-48S\Delta^2}}{1+e^{-8S\Delta^2}+e^{-24S\Delta^2}+e^{-48S\Delta^2}}$$

$$\approx \frac{4}{\sqrt{42}} \quad \text{if } m=3 \text{ (64-QAM)}$$

$$= 4\Delta\frac{1+3e^{-8S\Delta^2}+5e^{-24S\Delta^2}+7e^{-48S\Delta^2}+9e^{-80S\Delta^2}}{1+e^{-8S\Delta^2}+e^{-24S\Delta^2}+e^{-48S\Delta^2}+e^{-80S\Delta^2}}$$

$$\approx \frac{4}{\sqrt{170}} \quad \text{if } m=4 \text{ (256-QAM)}.$$

Approximations for $LLR_k(x)$, where $k<m-1$, are advantageously provided. For $0 \leq k < m-1$, $LLR_k(x)$ is an even function of x, and $LLR_k(x) \approx 0$ when $x = 2^{k+1}S\Delta$. $LLR_k(x)$ may be approximated by triangle functions for small values of x, and by straight lines for large values of x.

$$LLR_k(x) \approx LLR_k(0) \cdot \Big[\sum_{i=0}^{2^{m-2-k}-1}(-1)^i triang\Big(\frac{|x|}{2^{k+1}S\Delta} - 2i\Big) + $$

$$(-1)^{2^{m-2-k}} ramp\Big(\frac{|x|}{2^{k+1}S\Delta} - 2^{m-1-k} + 1\Big)\Big],$$

where $triang(x) \equiv \begin{cases} 1-|x| & \text{if } |x|<1 \\ 0 & \text{otherwise} \end{cases}$, and $ramp(x) \equiv \begin{cases} x & \text{if } x>0 \\ 0 & \text{otherwise} \end{cases}$.

It is helpful to separate the two cases k=m−2 and k<m−2. For k=m−2, the above expression simplifies to $$LLR_{m-2}(x) \approx LLR_k(0) \cdot \Big[triang\Big(\frac{|x|}{2^{m-1}S\Delta}\Big) - ramp\Big(\frac{|x|}{2^{m-1}S\Delta} - 1\Big)\Big]$$

$$= LLR_k(0) \cdot \Big[1 - \frac{|x|}{2^{m-1}S\Delta}\Big]$$

and for k<m−2, the above expression simplifies to $$LLR_k(x) \approx LLR_k(0) \cdot$$

$$\Big[\sum_{i=0}^{2^{m-2-k}-1}(-1)^i triang\Big(\frac{|x|}{2^{k+1}S\Delta} - 2i\Big) + ramp\Big(\frac{|x|}{2^{k+1}S\Delta} - 2^{m-1-k} + 1\Big)\Big]$$

It is thus sufficient to compute $LLR_k(0)$ for each k,m such that $0 \leq k < m-1$.

The case k=m−2 may advantageously be treated separately:

$$LLR_{m-2}(x)\big|_{x=0} = \ln\Big[\sum_{i=0}^{2^{m-2}-1} e^{-S\alpha_i^2}\Big] - \ln\Big[\sum_{i=2^{m-2}}^{2^{m-1}-1} e^{-S\alpha_i^2}\Big]$$

$$= \ln\Big[\sum_{i=0}^{2^{m-2}-1} e^{-S(2^{m-1}+2i+1)^2\Delta^2}\Big] -$$

$$\ln\Big[\sum_{i=0}^{2^{m-2}-1} e^{-S(2i+1)^2\Delta^2}\Big] < 0$$

For k<m−2, the following equations hold:

$$LLR_k(x)\big|_{x=0} = \ln\Big[\sum_{\substack{0 \leq l < 2^{m-1-k}, \\ l\%4=0,3}} \sum_{i=l\cdot 2^k}^{(l+1)\cdot 2^k-1} e^{-S\alpha_i^2}\Big] - \ln\Big[\sum_{\substack{0 \leq l < 2^{m-1-k}, \\ l\%4=1,2}} \sum_{i=l\cdot 2^k}^{(l+1)\cdot 2^k-1} e^{-S\alpha_i^2}\Big]$$

$$= \ln\Big[\sum_{\substack{0 \leq l < 2^{m-1-k}, \\ l\%4=0,3}} \sum_{i=0}^{2^k-1} e^{-S(l\cdot 2^{k+1}+2i+1)^2\Delta^2}\Big] -$$

$$\ln\Big[\sum_{\substack{0 \leq l < 2^{m-1-k}, \\ l\%4=1,2}} \sum_{i=0}^{2^k-1} e^{-S(l\cdot 2^{k+1}+2i+1)^2\Delta^2}\Big] > 0$$

If the above results are specialized to m=2, 3 and 4, $$LLR_{m-2}(x)\big|_{x=0} = -8\Delta^2 S = -0.8S \quad \text{for } m=2 \text{ (16-QAM)}$$

$$= -\ln\Big[\frac{1+e^{-8\Delta^2 S}}{e^{-24\Delta^2 S}+e^{-48\Delta^2 S}}\Big]$$

$$= -\ln\Big[\frac{1+e^{-(\frac{4}{21})S}}{e^{-(\frac{12}{21})S}+e^{-(\frac{24}{21})S}}\Big] \quad \text{for } m=3 \text{ (64-QAM)}$$

$$= -\ln\Big[\frac{1+e^{-8\Delta^2 S}+e^{-24\Delta^2 S}+e^{-48\Delta^2 S}}{e^{-80\Delta^2 S}+e^{-120\Delta^2 S}+e^{-168\Delta^2 S}+e^{-224\Delta^2 S}}\Big]$$

-continued $$= -\ln\left[\frac{1 + e^{-(\frac{4}{85})S} + e^{-(\frac{12}{85})S} + e^{-(\frac{24}{85})S}}{e^{-(\frac{8}{17})S} + e^{-(\frac{12}{17})S} + e^{-(\frac{84}{85})S} + e^{-(\frac{112}{85})S}}\right]$$

for $m = 4$ (256-$QAM$)

$$LLR_{m-3}(x)\big|_{x=0} = -\ln\left[\frac{1 + e^{-48\Delta^2 S}}{e^{-8\Delta^2 S} + e^{-24\Delta^2 S}}\right]$$

$$= -\ln\left[\frac{1 + e^{-(\frac{24}{21})S}}{e^{-(\frac{4}{21})S} + e^{-(\frac{12}{21})S}}\right] \text{ for } m = 3 \ (64\text{-}QAM)$$

$$= -\ln\left[\frac{1 + e^{-8\Delta^2 S} + e^{-168\Delta^2 S} + e^{-224\Delta^2 S}}{e^{-24\Delta^2 S} + e^{-48\Delta^2 S} + e^{-80\Delta^2 S} + e^{-120\Delta^2 S}}\right]$$

$$= -\ln\left[\frac{1 + e^{-(\frac{4}{85})S} + e^{-(\frac{84}{85})S} + e^{-(\frac{112}{85})S}}{e^{-(\frac{12}{85})S} + e^{-(\frac{24}{85})S} + e^{-(\frac{8}{17})S} + e^{-(\frac{12}{17})S}}\right]$$

for $m = 4$ (256-$QAM$)

$$LLR_{m-4}(x)\big|_{x=0} = -\ln\left[\frac{1 + e^{-48\Delta^2 S} + e^{-80\Delta^2 S} + e^{-224\Delta^2 S}}{e^{-8\Delta^2 S} + e^{-24\Delta^2 S} + e^{-120\Delta^2 S} + e^{-168\Delta^2 S}}\right]$$

$$= -\ln\left[\frac{1 + e^{-(\frac{24}{85})S} + e^{-(\frac{8}{17})S} + e^{-(\frac{112}{85})S}}{e^{-(\frac{4}{85})S} + e^{-(\frac{12}{85})S} + e^{-(\frac{12}{17})S} + e^{-(\frac{84}{85})S}}\right]$$

for $m = 4$ (256-$QAM$)

For large values of the normalized SNR S, the above expressions may be approximated as follows:

$$LLR_{m-2}(x)\big|_{x=0} = -8\Delta^2 S = -0.8S \quad \text{for} \quad m = 2 \ (16\text{-}QAM)$$

$$\approx 24\Delta^2 S = \left(\frac{12}{21}\right)S \quad \text{for} \quad m = 3 \ (64\text{-}QAM)$$

$$\approx 80\Delta^2 S = \left(\frac{8}{17}\right)S \quad \text{for} \quad m = 4 \ (256\text{-}QAM)$$

$$LLR_{m-3}(x)\big|_{x=0} = 8\Delta^2 S = \left(\frac{4}{21}\right)S \quad \text{for} \quad m = 3 \ (64\text{-}QAM)$$

$$\approx 24\Delta^2 S = \left(\frac{12}{85}\right)S \quad \text{for} \quad m = 4 \ (256\text{-}QAM)$$

$$LLR_{m-4}(x)\big|_{x=0} \approx 8\Delta^2 S = \left(\frac{4}{85}\right)S \quad \text{for} \quad m = 4 \ (256\text{-}QAM).$$

In one embodiment a trigonometric approximation for the LLR associated with each code symbol is performed for an MPSK constellation. From FIGS. 17 and 18, it may be seen that $LLR_k(z)$ may be approximated by the sine function for $k=m-1$, and by the cosine function of the appropriate frequency for $k<m-1$. More precisely, $$LLR_{m-1}(Z) = LLR_{m-1}(X + jY)$$

$$= LLR_{m-1}(Re^{j\theta})$$

$$\approx LLR_{m-1}(jR)\sin\theta = \frac{LLR_{m-1}(jR)}{R}Y.$$

For $0 \leq k < m-1$, $$LLR_k(Z) = LLR_k(X + jY)$$

$$= LLR_k(R e^{j\theta})$$

$$\approx LLR_k(R)\cos[(m-1-k)\theta]$$

$$= \frac{LLR_k(R)}{R^{m-1-k}} R^{m-1-k}\cos[(m-1-k)\theta]$$

$$= \frac{LLR_k(R)}{R} \cdot \frac{\operatorname{Re}[(X + jY)^{m-1-k}]}{\left(\sqrt{X^2 + Y^2}\right)^{m-2-k}}$$

In particular, setting $k=m-2$ and $k=m-3$ yields, respectively $$LLR_{m-2}(Z) \approx \frac{LLR_{m-2}(R)}{R}X$$

and $$LLR_{m-3}(Z) \approx \frac{LLR_{m-3}(R)}{R^2}\operatorname{Re}[(X + jY)^2]$$

$$= \frac{LLR_{m-3}(R)}{R} \cdot \frac{X^2 - Y^2}{\sqrt{X^2 + Y^2}}.$$

It is necessary simply to evaluate $LLR_{m-1}(j\,R)$ and $LLR_k(R)$ for $k<m-1$. It may be shown that $$LLR_{m-1}(jR) = LLR_{m-2}(R)$$

$$= \ln\left[\frac{\sum_{i=0}^{2^{m-2}-1} e^{2R\cos\left(\frac{\pi}{2^m}(2i+1)\right)}}{\sum_{i=0}^{2^{m-2}-1} e^{-2R\sin\left(\frac{\pi}{2^m}(2i+1)\right)}}\right].$$

For $k<m-2$, $$LLR_k(R) = \ln\left[\sum_{\substack{0 \leq l < 2^{m-1-k} \\ l \,\%\, 4 = 0,3}} \sum_{i=0}^{2^k-1} e^{2R\cos\left(\frac{\pi}{2^m}(l \cdot 2^{k+1}+2i+1)\right)}\right] -$$

$$\ln\left[\sum_{\substack{0 \leq l < 2^{m-1-k} \\ l \,\%\, 4 = 1,2}} \sum_{i=0}^{2^k-1} e^{2R\cos\left(\frac{\pi}{2^m}(l \cdot 2^{k+1}+2i+1)\right)}\right]$$

The above results may be specialized to m=2,3, and 4, to yield the following sets of equations, respectively:

$$LLR_{m-1}(jR) = LLR_{m-2}(R)$$

$$= \ln\left[\frac{e^{2R\cos\left(\frac{\pi}{2}\right)}}{e^{-2R\sin\left(\frac{\pi}{2}\right)}}\right]$$

$$= 2\sqrt{2}\,R \quad \text{for } m = 2 \ (QPSK)$$

$$= \ln\left[\frac{e^{2R\cos\left(\frac{\pi}{8}\right)} + e^{2R\cos\left(\frac{3\pi}{8}\right)}}{e^{-2R\sin\left(\frac{\pi}{8}\right)} + e^{-2R\sin\left(\frac{3\pi}{8}\right)}}\right]$$

$$\approx 2\left[\cos\left(\frac{\pi}{8}\right) + \sin\left(\frac{\pi}{8}\right)\right]R \quad \text{for } m = 3 \ (8\text{-}PSK)$$

-continued $$= \ln\left[\frac{e^{2R\cos(\frac{\pi}{16})} + e^{2R\cos(\frac{3\pi}{16})} + e^{2R\cos(\frac{5\pi}{16})} + e^{2R\cos(\frac{7\pi}{16})}}{e^{-2R\sin(\frac{\pi}{16})} + e^{-2R\sin(\frac{3\pi}{16})} + e^{-2R\sin(\frac{5\pi}{16})} + e^{-2R\sin(\frac{7\pi}{16})}}\right]$$

$$\approx 2\left[\cos\left(\frac{\pi}{16}\right) + \sin\left(\frac{\pi}{16}\right)\right]R \quad \text{for } m = 4 \ (16\text{-}PSK)$$

$$LLR_{m-3}(R) = \ln\left[\frac{e^{2R\cos(\frac{\pi}{8})} + e^{2R\cos(\frac{7\pi}{8})}}{e^{2R\cos(\frac{3\pi}{8})} + e^{2R\cos(\frac{5\pi}{8})}}\right]$$

$$\approx 2\left[\cos\left(\frac{\pi}{8}\right) - \cos\left(\frac{3\pi}{8}\right)\right]R \quad \text{for } m = 3 \ (8\text{-}PSK)$$

$$= \ln\left[\frac{e^{2R\cos(\frac{\pi}{16})} + e^{2R\cos(\frac{3\pi}{16})} + e^{2R\cos(\frac{13\pi}{16})} + e^{2R\cos(\frac{15\pi}{16})}}{e^{2R\cos(\frac{5\pi}{16})} + e^{2R\cos(\frac{7\pi}{16})} + e^{2R\cos(\frac{9\pi}{16})} + e^{2R\cos(\frac{11\pi}{16})}}\right]$$

$$\approx 2\left[\cos\left(\frac{\pi}{16}\right) - \cos\left(\frac{5\pi}{16}\right)\right]R \quad \text{for } m = 4 \ (16\text{-}PSK)$$

$$LLR_{m-3}(R) = \ln\left[\frac{e^{2R\cos(\frac{\pi}{8})} + e^{2R\cos(\frac{7\pi}{8})}}{e^{2R\cos(\frac{3\pi}{8})} + e^{2R\cos(\frac{5\pi}{8})}}\right]$$

$$\approx 2\left[\cos\left(\frac{\pi}{8}\right) - \cos\left(\frac{3\pi}{8}\right)\right]R \quad \text{for } m = 3 \ (8\text{-}PSK)$$

$$= \ln\left[\frac{e^{2R\cos(\frac{\pi}{16})} + e^{2R\cos(\frac{3\pi}{16})} + e^{2R\cos(\frac{13\pi}{16})} + e^{2R\cos(\frac{15\pi}{16})}}{e^{2R\cos(\frac{5\pi}{16})} + e^{2R\cos(\frac{7\pi}{16})} + e^{2R\cos(\frac{9\pi}{16})} + e^{2R\cos(\frac{11\pi}{16})}}\right]$$

$$\approx 2\left[\cos\left(\frac{\pi}{16}\right) - \cos\left(\frac{5\pi}{16}\right)\right]R \quad \text{for } m = 4 \ (16\text{-}PSK)$$

$$LLR_{m-4}(R) = \ln\left[\frac{e^{2R\cos(\frac{\pi}{16})} + e^{2R\cos(\frac{7\pi}{16})} + e^{2R\cos(\frac{9\pi}{16})} + e^{2R\cos(\frac{15\pi}{16})}}{e^{2R\cos(\frac{3\pi}{16})} + e^{2R\cos(\frac{5\pi}{16})} + e^{2R\cos(\frac{11\pi}{16})} + e^{2R\cos(\frac{13\pi}{16})}}\right]$$

$$\approx 2\left[\cos\left(\frac{\pi}{16}\right) - \cos\left(\frac{3\pi}{16}\right)\right]R \quad \text{for } m = 4 \ (16\text{-}PSK)$$

Thus, a novel and improved method and apparatus for computing soft decision input metrics to a turbo decoder has been described. Those of skill in the art would understand that the various illustrative logical blocks, modules, circuits, and algorithm steps described in connection with the embodiments disclosed herein may be implemented as electronic hardware, computer software, or combinations of both. The various illustrative components, blocks, modules, circuits, and steps have been described generally in terms of their functionality. Whether the functionality is implemented as hardware or software depends upon the particular application and design constraints imposed on the overall system. Skilled artisans recognize the interchangeability of hardware and software under these circumstances, and how best to implement the described functionality for each particular application. As examples, the various illustrative logical blocks, modules, circuits, and algorithm steps described in connection with the embodiments disclosed herein may be implemented or performed with a digital signal processor (DSP), an application specific integrated circuit (ASIC), a field programmable gate array (FPGA) or other programmable logic device, discrete gate or transistor logic, discrete hardware components such as, e.g., registers and FIFO, a processor executing a set of firmware instructions, any conventional programmable software module and a processor, or any combination thereof. The processor may advantageously be a microprocessor, but in the alternative, the processor may be any conventional processor, controller, microcontroller, or state machine. The software module could reside in RAM memory, flash memory, ROM memory, EPROM memory, EEPROM memory, registers, hard disk, a removable disk, a CD-ROM, or any other form of storage medium known in the art. Those of skill would further appreciate that the data, instructions, commands, information, signals, bits, symbols, and chips that may be referenced throughout the above description are advantageously represented by voltages, currents, electromagnetic waves, magnetic fields or particles, optical fields or particles, or any combination thereof.

Preferred embodiments of the present invention have thus been shown and described. It would be apparent to one of ordinary skill in the art, however, that numerous alterations may be made to the embodiments herein disclosed without departing from the spirit or scope of the invention. Therefore, the present invention is not to be limited except in accordance with the following claims.

What is claimed is:

1. A method of approximating log-likelihood ratio metrics for a plurality of turbo encoded symbols, the plurality of turbo encoded symbol having been modulated with M-ary phase shift keyed signal constellations having gray code labeling, the method comprising the steps of:
   extracting a complex-valued modulation symbol soft decision on a modulation symbol, the modulation symbol being associated with a plurality of turbo encoded symbols, the complex-valued modulation symbol soft decision having an in-phase component and a quadrature component;
   scaling the quadrature component to obtain a log-likelihood ratio metric for a most-significant code symbol of the modulation symbol;
   scaling the in-phase component to obtain a log-likelihood ratio metric for a second-most-significant code symbol of the modulation symbol; and
   applying a product of a first number and a second number to the complex-valued modulation symbol soft decision to obtain log-likelihood ratio metrics for remaining code symbols of the modulation symbol, the first number being dependent on a magnitude of the complex-valued modulation symbol soft decision, and the second number being dependent on a phase of the complex-valued modulation symbol soft decision.

2. The method of claim 1, further comprising the steps of calculating the cosine value of an angle of the complex-valued modulation symbol soft decision, and scaling the cosine value to generate the second number.

3. The method of claim 1, further comprising the steps of raising the complex-valued modulation symbol soft decision to a power, extracting a real part of the complex-valued modulation symbol soft decision raised to the power, and dividing the real part by a power of the magnitude to generate the second number.

4. The method of claim 1, further comprising the steps of scaling the magnitude by a first plurality of different scale factors to generate a first plurality of scaled magnitudes, exponentiating each of the first plurality of scaled magnitudes, summing the exponentiated scaled magnitudes, calculating the logarithm of the sum to generate a first log value, scaling the magnitude by a second plurality of different scale factors to generate a second plurality of scaled magnitudes, exponentiating each of the second plurality of scaled magnitudes, summing the exponentiated scaled magnitudes, calculating the logarithm of the sum to generate a second log value, and subtracting the second log value from the first log value to generate the first number.

5. The method of claim 1, further comprising the step of scaling the magnitude to generate the first number.

6. A receiver configured to approximate log-likelihood ratio metrics for a plurality of turbo encoded symbols, the plurality of turbo encoded symbol having been modulated with M-ary phase shift keyed signal constellations having gray code labeling, the receiver comprising:

a demodulator configured to extract a complex-valued modulation symbol soft decision on a received modulation symbol, the modulation symbol being associated with a plurality of turbo encoded symbols, the complex-valued modulation symbol soft decision having an in-phase component and a quadrature component; and a log-likelihood ratio computation module coupled to the demodulator and configured to receive the complex-valued modulation symbol soft decision from the demodulator, scale the quadrature component to obtain a log-likelihood ratio metric for a most-significant code symbol of the modulation symbol, scale the in-phase component to obtain a log-likelihood ratio metric for a second-most-significant code symbol of the modulation symbol, and apply a product of a first number and a second number to the complex-valued modulation symbol soft decision to obtain log-likelihood ratio metrics for remaining code symbols of the modulation symbol, the first number being dependent on a magnitude of the complex-valued modulation symbol soft decision, and the second number being dependent on a phase of the complex-valued modulation symbol soft decision.

7. The receiver of claim 6, wherein the log-likelihood ratio computation module is further configured to calculate the cosine value of an angle of the complex-valued modulation symbol soft decision, and scale the cosine value to generate the second number.

8. The receiver of claim 6, wherein the log-likelihood ratio computation module is further configured to raise the complex-valued modulation symbol soft decision to a power, extract a real part of the complex-valued modulation symbol soft decision raised to the power, and divide the real part by a power of the magnitude to generate the second number.

9. The receiver of claim 6, wherein the log-likelihood ratio computation module is further configured to scale the magnitude by a first plurality of different scale factors to generate a first plurality of scaled magnitudes, exponentiate each of the first plurality of scaled magnitudes, sum the exponentiated scaled magnitudes, calculate the logarithm of the sum to generate a first log value, scale the magnitude by a second plurality of different scale factors to generate a second plurality of scaled magnitudes, exponentiate each of the second plurality of scaled magnitudes, sum the exponentiated scaled magnitudes, calculate the logarithm of the sum to generate a second log value, and subtract the second log value from the first log value to generate the first number.

10. The receiver of claim 6, wherein the log-likelihood ratio computation module is further configured to scale the magnitude to generate the first number.

11. A receiver configured to approximate log-likelihood ratio metrics for a plurality of turbo encoded symbols, the plurality of turbo encoded symbol having been modulated with M-ary phase shift keyed signal constellations having gray code labeling, the receiver comprising:

means for extracting a complex-valued modulation symbol soft decision on a received modulation symbol, the modulation symbol being associated with a plurality of turbo encoded symbols, the complex-valued modulation symbol soft decision having an in-phase component and a quadrature component;

means for scaling the quadrature component to obtain a log-likelihood ratio metric for a most-significant code symbol of the modulation symbol;

means for scaling the in-phase component to obtain a log-likelihood ratio metric for a second-most-significant code symbol of the modulation symbol; and means for applying a product of a first number and a second number to the complex-valued modulation symbol soft decision to obtain log-likelihood ratio metrics for remaining code symbols of the modulation symbol, the first number being dependent on a magnitude of the complex-valued modulation symbol soft decision, and the second number being dependent on a phase of the complex-valued modulation symbol soft decision.

12. A receiver configured to approximate log-likelihood ratio metrics for a plurality of turbo encoded symbols, the plurality of turbo encoded symbol having been modulated with M-ary phase shift keyed signal constellations having gray code labeling, the receiver comprising:

a processor; and a processor-readable storage medium coupled to the processor and containing a set of instructions executable by the processor to extract a complex-valued modulation symbol soft decision on a received modulation symbol, the modulation symbol being associated with a plurality of turbo encoded symbols, the complex-valued modulation symbol soft decision having an in-phase component and a quadrature component, scale the quadrature component to obtain a log-likelihood ratio metric for a most-significant code symbol of the modulation symbol, scale the in-phase component to obtain a log-likelihood ratio metric for a second-most-significant code symbol of the modulation symbol, and apply a product of a first number and a second number to the complex-valued modulation symbol soft decision to obtain log-likelihood ratio metrics for remaining code symbols of the modulation symbol, the first number being dependent on a magnitude of the complex-valued modulation symbol soft decision, and the second number being dependent on a phase of the complex-valued modulation symbol soft decision.

13. The receiver of claim 12, wherein the set of instructions is further executable by the processor to calculate the cosine value of an angle of the complex-valued modulation symbol soft decision, and scale the cosine value to generate the second number.

14. The receiver of claim 12, wherein the set of instructions is further executable by the processor to raise the complex-valued modulation symbol soft decision to a power, extract a real part of the complex-valued modulation symbol soft decision raised to the power, and divide the real part by a power of the magnitude to generate the second number.

15. The receiver of claim 12, wherein the set of instructions is further executable by the processor to scale the magnitude by a first plurality of different scale factors to generate a first plurality of scaled magnitudes, exponentiate each of the first plurality of scaled magnitudes, sum the exponentiated scaled magnitudes, calculate the logarithm of the sum to generate a first log value, scale the magnitude by a second plurality of different scale factors to generate a second plurality of scaled magnitudes, exponentiate each of the second plurality of scaled magnitudes, sum the exponentiated scaled magnitudes, calculate the logarithm of the sum to generate a second log value, and subtract the second log value from the first log value to generate the first number.

16. The receiver of claim 12, wherein the set of instructions is further executable by the processor to scale the magnitude to generate the first number.

* * * * *